(12) United States Patent
Saito

(10) Patent No.: US 12,091,095 B2
(45) Date of Patent: Sep. 17, 2024

(54) AUTOMOTIVE BODY ADHESIVE BONDING POSITION OPTIMIZATION ANALYSIS METHOD AND OPTIMIZATION ANALYSIS DEVICE

(71) Applicant: JFE Steel Corporation, Tokyo (JP)

(72) Inventor: Takanobu Saito, Tokyo (JP)

(73) Assignee: JFE Steel Corporation, Tokyo (JP)

( * ) Notice: Subject to any disclaimer, the term of this patent is extended or adjusted under 35 U.S.C. 154(b) by 967 days.

(21) Appl. No.: 16/966,126

(22) PCT Filed: Nov. 27, 2018

(86) PCT No.: PCT/JP2018/043462
§ 371 (c)(1),
(2) Date: Jul. 30, 2020

(87) PCT Pub. No.: WO2019/155730
PCT Pub. Date: Aug. 15, 2019

(65) Prior Publication Data
US 2021/0024142 A1    Jan. 28, 2021

(30) Foreign Application Priority Data

Feb. 9, 2018 (JP) .................................. 2018-021813

(51) Int. Cl.
*B62D 27/02* (2006.01)
*G06F 30/15* (2020.01)
*G06F 30/20* (2020.01)

(52) U.S. Cl.
CPC ........... *B62D 27/026* (2013.01); *G06F 30/15* (2020.01); *G06F 30/20* (2020.01)

(58) Field of Classification Search
CPC ........ B62D 27/026; G06F 30/20; G06F 30/15
(Continued)

(56) References Cited

U.S. PATENT DOCUMENTS 5,729,463 A * 3/1998 Koenig ................... B23K 11/11
                                                                     703/2
6,766,206 B1 * 7/2004 Jasuja ..................... G06F 30/15
                                                                     703/2
(Continued)

FOREIGN PATENT DOCUMENTS

CN        104781816 A        7/2015
CN        104956369 A   *    9/2015   ............. G06F 17/50
(Continued)

OTHER PUBLICATIONS

WO-2018008233-A1 computer translation (Year: 2018).*
(Continued)

*Primary Examiner* — Brian S Cook
(74) *Attorney, Agent, or Firm* — Buchanan Ingersoll & Rooney PC

(57) ABSTRACT

An automotive body adhesive bonding position optimization analysis method of obtaining an optimum position at which a parts set is adhesive-bonded with a structural adhesive in combination with welding, the method including: disposing an adhesive element as the structural adhesive at a position on a body structure model as a candidate at which adhesive bonding is performed with the structural adhesive; setting an optimization analysis condition including a loading condition applied to the body structure model in optimization analysis, to the body structure model on which the adhesive element is disposed; and performing optimization analysis on the adhesive element as an optimization analysis object in the body structure model to which the optimization analysis condition is set so as to obtain a position of the adhesive element satisfying the optimization analysis condition as the position at which adhesive bonding is performed with the structural adhesive.

8 Claims, 22 Drawing Sheets

(58) Field of Classification Search
USPC .......................................................... 703/8
See application file for complete search history.

(56) References Cited

U.S. PATENT DOCUMENTS

| | | |
|---|---|---|
| 2005/0197822 A1 | 9/2005 | Onodera et al. |
| 2010/0262406 A1 | 10/2010 | Goel et al. |
| 2015/0298236 A1 | 10/2015 | Saito |

FOREIGN PATENT DOCUMENTS

| | | | |
|---|---|---|---|
| CN | 107506545 A | 12/2017 | |
| JP | 2005250647 A | 9/2005 | |
| JP | 2010250818 A | 11/2010 | |
| JP | 2014149734 A | 8/2014 | |
| JP | 2016071770 A | 5/2016 | |
| JP | 6222302 B1 | 11/2017 | |
| JP | 2018005677 A | 1/2018 | |
| WO | WO-2018008233 A1 * | 1/2018 | ............. B62D 65/00 |

OTHER PUBLICATIONS

Jiang, T. et al., "A Systems Approach to Structural Topology Optimization: Designing Optimal Connections," Mar. 1, 1997, vol. 119(1), pp. 40-47, XP055778211, Journal of Mechanical Design.
Saito, T. et al., "A Study of Topology Optimization for Joint Locations of Automotive Full Vehicle", Dec. 6, 2017, pp. 1851-1862, XP055778259, Proceedings of the 12th World Congress on Structural and Multidisciplinary Optimization, Springer International Publishing.
Extended European Search Report for European Application No. 18 905 652.6, dated Mar. 3, 2021, 14 pages.
Korean Office Action for Korean Application No. 10-2020-7023310, dated Jan. 25, 2022, with Concise Statement of Relevance of Office Action, 6 pages.
International Search Report and Written Opinion for International Application No. PCT/JP2018/043462, dated Feb. 12, 2019, 6 pages.
Chinese Office Action with Search Report for Chinese Application No. 201880088643.2, dated Mar. 31, 2023, 9 pages.

* cited by examiner (a)

(b)

(FRONT SIDE) ←————————→ (REAR SIDE)

(a)

(b)

(a) HAVING NO MASS SETTING (b) HAVING DOOR SETTING

DISPLAY MAGNIFICATION OF DISPLACEMENT: 1000 TIMES

DISPLAY MAGNIFICATION OF DISPLACEMENT: 1000 TIMES

FIRST INVENTION EXAMPLE: HAVING NO MASS SETTING, DRIVING ANALYSIS LOAD (a)

(b)

(c)

FIRST COMPARATIVE EXAMPLE: HAVING NO MASS SETTING, VIRTUAL LOAD (a)

(b)

(c)

SECOND INVENTION EXAMPLE: HAVING MASS SETTING, DRIVING ANALYSIS LOAD (a)

(b)

(c)

THIRD INVENTION EXAMPLE: HAVING MASS SETTING, VIRTUAL LOAD (a)

(b)

(c)

FOURTH INVENTION EXAMPLE: HAVING DOOR SETTING, DRIVING ANALYSIS LOAD (a)

(b)

(c)

FIFTH INVENTION EXAMPLE: HAVING DOOR SETTING, VIRTUAL LOAD

AUTOMOTIVE BODY ADHESIVE BONDING POSITION OPTIMIZATION ANALYSIS METHOD AND OPTIMIZATION ANALYSIS DEVICE

CROSS REFERENCE TO RELATED APPLICATIONS

This is the U.S. National Phase application of PCT/JP2018/043462, filed Nov. 27, 2018, which claims priority to Japanese Patent Application No. 2018-021813, filed Feb. 9, 2018, the disclosures of these applications being incorporated herein by reference in their entireties for all purposes.

FIELD OF THE INVENTION

The present invention relates to an automotive body adhesive bonding position optimization analysis method and optimization analysis device, specifically, relates to an optimization analysis method and an optimization analysis device for an adhesive bonding position of an automotive body for obtaining an optimum position at which adhesive bonding is performed with a structural adhesive in a case of using welding and the structural adhesive at the same time.

BACKGROUND OF THE INVENTION

In recent years, weight reduction of automotive body is advanced due to environmental problems in an automotive industry, and computer aided engineering (hereinafter referred to as "CAE") analysis has become an essential technique for designing automotive bodies. In the CAE analysis, stiffness analysis, crashworthiness analysis, vibration analysis, and the like are performed to greatly contribute to improvement in automotive-body performance. The CAE analysis achieves not only weight reduction of automotive body but also design support for an automotive body the various properties of which are improved, the various properties including stiffness, crashworthiness performance, and the like, not only by simply performing performance evaluation but also by using optimization analysis techniques such as mathematical optimization, thickness optimization, shape optimization, and topology optimization.

As an example of design support for automotive body using the optimization analysis technique, for example, Patent Literature 1 discloses a technique of optimizing a component as a complicated structure by topology optimization.

PATENT LITERATURE

Patent Literature 1: Japanese Patent Application Laid-open No. 2010-250818

SUMMARY OF THE INVENTION

A structure such as an automotive body is formed by joining a plurality of parts to be a parts set by welding and the like, and it is known that stiffness of the entire structure is improved by increasing a joining amount at a portion to be joined (for example, addition of a spot welding point and the like). However, in view of costs, it is desired that the joining amount is reduced to be as small as possible.

To improve the stiffness of the automotive body, it is known to be effective to perform adhesive bonding by applying a structural adhesive in combination with welding for joining the parts. However, to perform adhesive bonding on all flange portions for joining the parts of the automotive body, there may be a case in which the structural adhesive is applied over a length of 100 m or more, so that it takes much time for the application over such a length, and a problem of production cost is caused.

Thus, to improve performance such as the stiffness of the automotive body, the optimum position at which adhesive bonding is performed with the structural adhesive in combination with the welding may be obtained by applying the optimization technique disclosed in Patent Literature 1. However, Patent Literature 1 does not disclose how to apply the optimization technique regarding optimization of the position at which adhesive bonding is performed with the structural adhesive in combination with the welding for forming the structure such as the automotive body. Thus, there has been a demand for a technique of obtaining the optimum position at which adhesive bonding is performed with the structural adhesive in a case of using the structural adhesive in combination with the welding.

Aspects of the present invention are made in view of the problem as described above, and an object thereof is to provide an automotive body adhesive bonding position optimization analysis method and optimization analysis device to obtain an optimum position at which a parts set is adhesive-bonded with a structural adhesive in combination with welding, using a body structure model of an automobile to which a plurality of parts are welded as the parts set.

To solve the problem and achieve the object, an automotive body adhesive bonding position optimization analysis method according to aspects of the present invention of obtaining an optimum position at which a parts set is adhesive-bonded with a structural adhesive in combination with welding, using a body structure model including parts constituted of two-dimensional elements and/or three-dimensional elements and having welding portions set in advance to which the parts are welded as the parts set. The automotive body adhesive bonding position optimization analysis method includes: an adhesive bonding candidate position setting step of disposing, by a computer, an adhesive element as the structural adhesive at a position as a candidate at which adhesive bonding is performed with the structural adhesive; an optimization analysis condition setting step of setting, by the computer based on an instruction from an operator, an optimization analysis condition including a loading condition applied to the body structure model in optimization analysis, to the body structure model on which the adhesive element is disposed; and an optimization analysis step of performing, by the computer, optimization analysis on the adhesive element as an optimization analysis object in the body structure model to which the optimization analysis condition is set so as to obtain a position of the adhesive element satisfying the optimization analysis condition as the position at which adhesive bonding is performed with the structural adhesive.

Moreover, in the automotive body adhesive bonding position optimization analysis method according to aspects of the present invention, a plurality of the adhesive elements are successively disposed at the adhesive bonding candidate position setting step.

Moreover, the automotive body adhesive bonding position optimization analysis method according to aspects of the present invention includes: an automobile model generation step of generating, by the computer, an automobile model by connecting a chassis model to the body structure model to which equipment for door assembly or closure panels are set; and a driving analysis step of performing, by the computer, driving analysis of the automobile model so as to acquire, as a loading condition, a load and/or displacement caused at a connecting point of the body structure model with respect to the chassis model at the time of driving, wherein the loading condition acquired at the driving analysis step is the loading condition for the optimization analysis condition setting step.

Moreover, the automotive body adhesive bonding position optimization analysis method according to aspects of the present invention includes: an automobile model generation step of generating, by the computer, an automobile model by connecting a chassis model to a body structure model to which mass corresponding to equipment for door assembly or closure panels is set; and a driving analysis step of performing, by the computer, driving analysis of the automobile model so as to acquire, as a loading condition, a load and/or displacement caused at a connecting point of the body structure model with respect to the chassis model at the time of driving, wherein the loading condition acquired at the driving analysis step is the loading condition for the optimization analysis condition setting step.

Moreover, in the automotive body adhesive bonding position optimization analysis method according to aspects of the present invention, the adhesive elements are disposed in the body structure model to which equipment for door assembly and/or closure panels are set at the adhesive bonding candidate position setting step.

Moreover, in the automotive body adhesive bonding position optimization analysis method according to aspects of the present invention, the adhesive elements are disposed on a body structure model to which mass corresponding to equipment for door assembly and/or closure panels is set at the adhesive bonding candidate position setting step.

Moreover, an automotive body adhesive bonding position optimization analysis device according to aspects of the present invention for obtaining an optimum position at which a parts set is adhesive-bonded with a structural adhesive in combination with welding, using a body structure model including parts constituted of two-dimensional elements and/or three-dimensional elements and having welding portions set in advance to which the parts are welded as the parts set. The automotive body adhesive bonding position optimization analysis device includes: an adhesive bonding candidate position setting unit configured to dispose an adhesive element as the structural adhesive at a position as a candidate at which adhesive bonding is performed with the structural adhesive; an optimization analysis condition setting unit configured to set an optimization analysis condition including a loading condition applied to the body structure model in optimization analysis, to the body structure model in which the adhesive element is disposed; and an optimization analysis unit configured to perform optimization analysis on the adhesive element as an optimization analysis object in the body structure model to which the optimization analysis condition is set so as to obtain a position of the adhesive element satisfying the optimization analysis condition as the position at which adhesive bonding is performed with the structural adhesive.

Moreover, in the automotive body adhesive bonding position optimization analysis device according to aspects of the present invention, the adhesive bonding candidate position setting unit successively dispose a plurality of the adhesive elements.

Moreover, the automotive body adhesive bonding position optimization analysis device according to aspects of the present invention includes: an automobile model generation unit configured to generate an automobile model by connecting a chassis model to a body structure model to which equipment for door assembly or closure panels are set; and a driving analysis unit configured to perform driving analysis of the automobile model so as to acquire, as a loading condition, a load and/or displacement caused at a connecting point of the body structure model with respect to the chassis model at the time of driving, wherein the loading condition acquired by the driving analysis unit is the loading condition for the optimization analysis condition setting unit.

Moreover, the automotive body adhesive bonding position optimization analysis device according to aspects of the present invention includes: an automobile model generation unit configured to generate an automobile model by connecting a chassis model to a body structure model to which mass corresponding to equipment for door assembly or closure panels is set; and a driving analysis unit configured to perform driving analysis of the automobile model so as to acquire, as a loading condition, a load and/or displacement caused at a connecting point of the body structure model with respect to the chassis model at the time of driving, wherein the loading condition acquired by the driving analysis unit is the loading condition for the optimization analysis condition setting unit.

Moreover, in the automotive body adhesive bonding position optimization analysis device according to aspects of the present invention, the adhesive bonding candidate position setting unit disposes the adhesive element on a body structure model to which equipment for door assembly and/or closure panels are set.

Moreover, in the automotive body adhesive bonding position optimization analysis device according to aspects of the present invention, the adhesive bonding candidate position setting unit disposes the adhesive element on a body structure model to which mass corresponding to equipment for door assembly and/or closure panels is set.

According to aspects of the present invention, optimization analysis can be performed by giving the loading condition working on the body structure model of the automobile assuming the time of driving of the automobile, and it is possible to accurately obtain the optimum position at which the parts set is adhesive-bonded with the structural adhesive in combination with the welding.

DETAILED DESCRIPTION OF EMBODIMENTS OF THE INVENTION

The following describes an optimization method and an optimization device for an adhesive bonding position of an automotive body according to an embodiment of the present invention with reference to FIG. 1 to FIG. 16. Before explaining the optimization method and the optimization device for the adhesive bonding position of the automotive body, the following describes a body structure model as an object according to aspects of the present invention.

Body Structure Model

The body structure model used in accordance with aspects of the present invention is constituted of a plurality of parts such as chassis parts, and each of the parts of the body structure model is modeled by using a two-dimensional element and/or a three-dimensional element. The body structure model used in accordance with aspects of the present invention includes a welding portion for welding the parts as a parts set, a fixed connecting portion for fixing or connecting equipment for door assembly or closure panels, and a connecting point to be connected to an automotive body model including a suspension structure and a steering structure.

Figure 2:
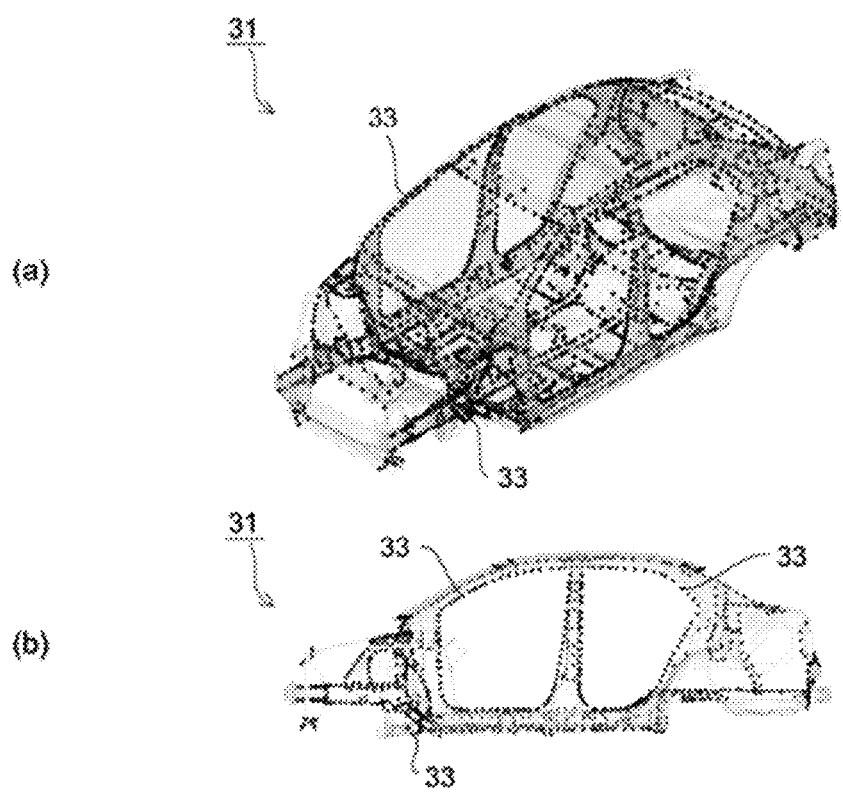
FIG. 2 is an explanatory diagram for explaining a body structure model used in the present embodiment and welding portions set in advance to the body structure model ((a): perspective view, (b): side view).
Figure 3:
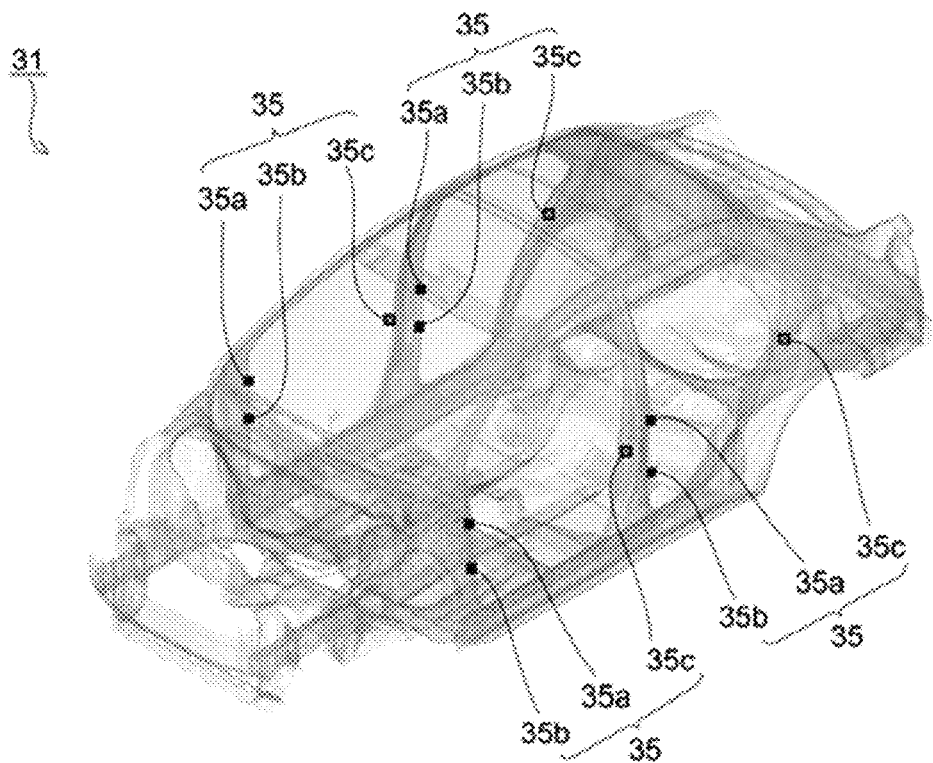
FIG. 3 is an explanatory diagram for explaining the body structure model used in the present embodiment and fixed connecting portions set to the body structure model.
Figure 4:
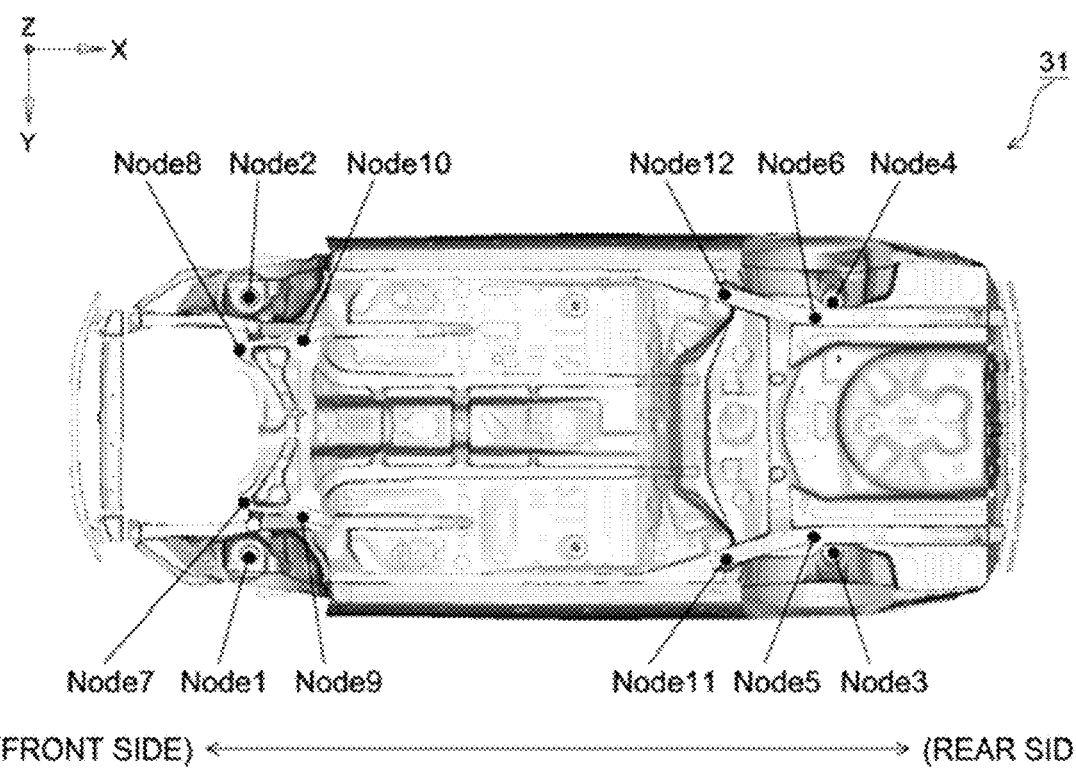
FIG. 4 is a diagram for explaining positions of connecting points to be connected to a chassis model in the body structure model used in the present embodiment.

FIG. 2 to FIG. 4 illustrate an example of a body structure model 31. As illustrated in FIG. 2, welding portions 33 for welding respective parts sets are set in advance to the body structure model 31. The welding portions 33 set in advance to the body structure model according to aspects of the present invention includes a welding point subjected to spot welding, and a portion successively welded by arc welding or laser welding.

As illustrated in FIG. 3, a hinge 35a, a hinge 35b, and a striker 35c as fixed connecting portions 35 are set to the body structure model 31, the fixed connecting portions 35 for fixing or connecting revolving doors as closure panels.

The fixed connecting portions of the body structure model according to aspects of the present invention are not limited thereto, and include, for example, a portion for fixing equipment for door assembly such as an engine mount that fixes an engine, and a portion for fixing or connecting closure panels such as a slide door other than the revolving door or a bonnet.

Additionally, as illustrated in FIG. 4, connecting points (Nodes 1 to 12 in FIG. 4) to be connected to a chassis model 51 (refer to FIG. 5) including the suspension structure and the steering structure are set to the body structure model 31, the suspension structure including a tire, a suspension arm, a suspension spring, a shock absorber, and the like, and the steering structure including a steering wheel and the like. In FIG. 4, six connecting points (Nodes 1, 2, 7, 8, 9, and 10) are set on a front side, and six connecting points (Nodes 3, 4, 5, 6, 11, and 12) are set on a rear side. In FIG. 4, the X-axis indicates an automotive body longitudinal direction, the Y-axis indicates an automotive body width direction, and the Z-axis indicates an automotive body height direction (the same applies to the other drawings).

The body structure model 31 is obtained by modeling a body structure as an elastic body, a viscoelastic body, or an elastic-plastic body to analyze deformation behavior and the like at the time when a load or inertia force acts thereon. The chassis model 51 (FIG. 5) to be connected to the connecting point of the body structure model 31 is also obtained by modeling parts (links) such as a suspension arm as a rigid body, an elastic body, or an elastic-plastic body, and modeling the tire and the suspension spring as an elastic body, a viscoelastic body, or an elastic-plastic body.

A body structure model file 30 (refer to FIG. 1) stores element information of the respective parts constituting the body structure model 31 and the like, and information about the welding portion 33 (FIG. 2) for each parts set, the fixed connecting portion 35 (FIG. 3) for fixing or connecting the equipment for door assembly or the closure panels, the connecting point (FIG. 4) to be connected to the suspension structure, and the like.

Optimization Analysis Device for Adhesive Bonding Position of Automotive Body

The following describes a configuration of an optimization analysis device 1 for the adhesive bonding position of the automotive body according to the embodiment of the present invention (hereinafter simply referred to as the "optimization analysis device 1") mainly based on the block diagram illustrated in FIG. 1.

The optimization analysis device 1 is a device for obtaining an optimum position at which adhesive bonding is performed with a structural adhesive in combination with welding for joining a plurality of parts constituting the body structure model 31 (refer to FIG. 2 to FIG. 4) as a parts set, constituted of a personal computer (PC) and the like, and includes a display device 3, an input device 5, a memory storage 7, a working data memory 9, and an arithmetic processing unit 11. The display device 3, the input device 5, the memory storage 7, and the working data memory 9 are connected to the arithmetic processing unit 11, and respective functions thereof are executed by a command from the arithmetic processing unit 11.

Display Device

The display device 3 is used for displaying an analysis result and the like, and is constituted of a liquid crystal monitor and the like.

Input Device

The input device 5 is used for a display instruction for the body structure model file 30, a condition input performed by an operator, and the like, and is constituted of a keyboard, a mouse, and the like.

Memory Storage

The memory storage 7 is used for storage of various files such as the body structure model file 30 and the like, and is constituted of a hard disk and the like.

Working Data Memory

The working data memory 9 is used for temporary storage of data used by the arithmetic processing unit 11 and an arithmetic operation, and is constituted of a random access memory (RAM) and the like.

Arithmetic Processing Unit

Figure 1:
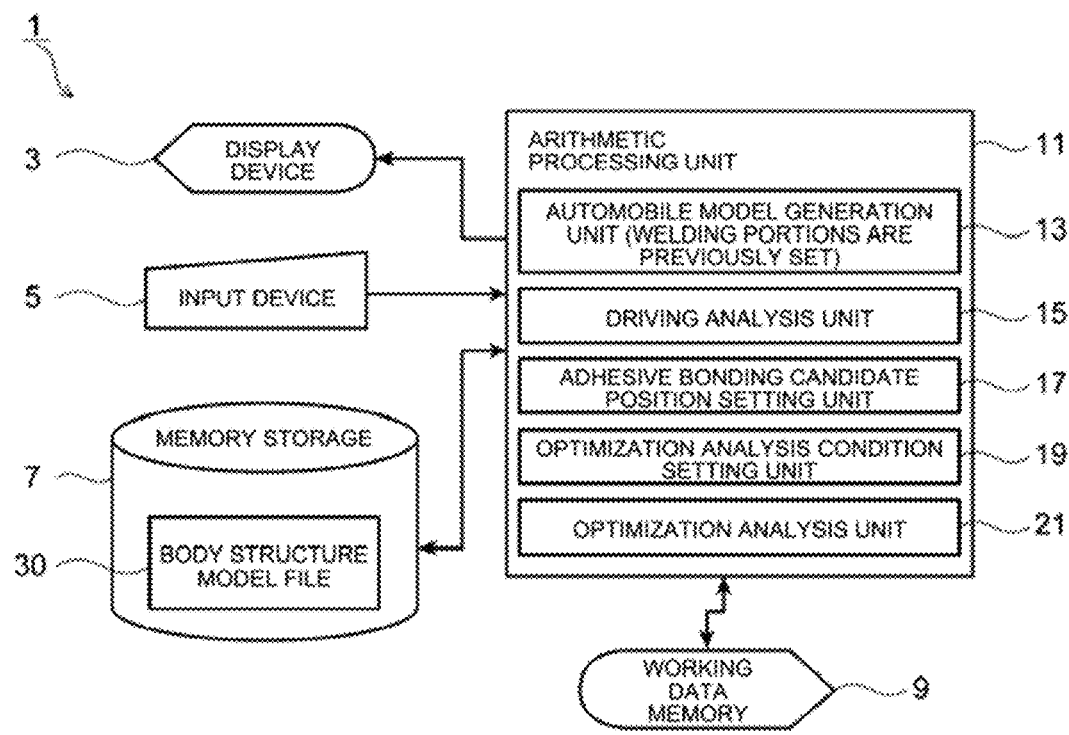
FIG. 1 is a block diagram of an optimization analysis device for an adhesive bonding position of an automotive body according to an embodiment of the present invention.

As illustrated in FIG. 1, the arithmetic processing unit 11 includes an automobile model generation unit 13, a driving analysis unit 15, an adhesive bonding candidate position setting unit 17, an optimization analysis condition setting unit 19, and an optimization analysis unit 21, and is constituted of a central processing unit (CPU) such as a PC. These units function when the CPU executes a predetermined computer program.

The following describes functions of the respective units in the arithmetic processing unit 11. Specific processing content of the function of each of the units in the arithmetic processing unit 11 will be described in "Optimization analysis method for adhesive bonding position of automotive body" described later.

Automobile Model Generation Unit

Figure 5:
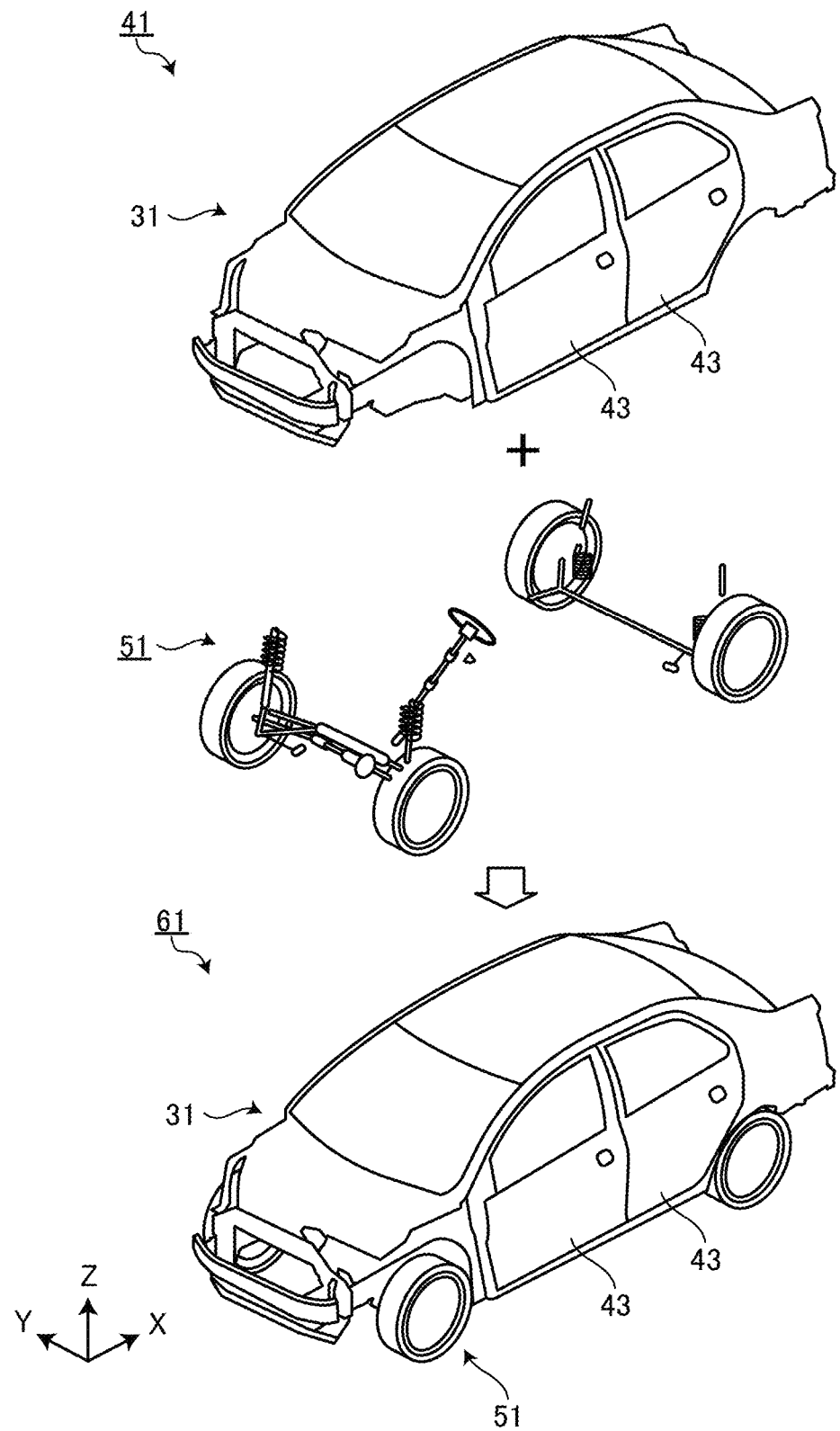
FIG. 5 is a diagram for explaining generation of an automobile model used for driving analysis according to the present embodiment (perspective view).
Figure 6:
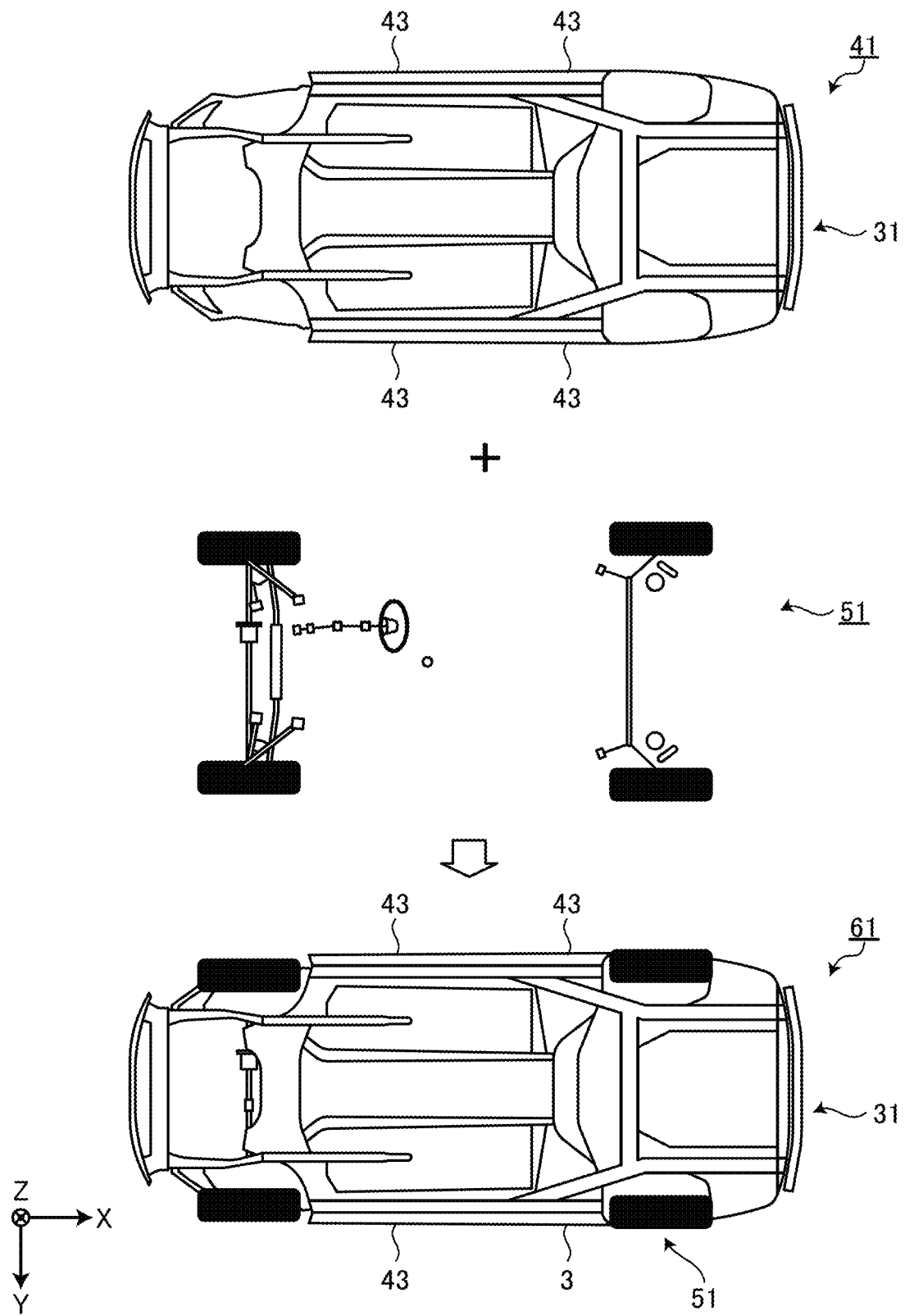
FIG. 6 is a diagram for explaining generation of an automobile model used for driving analysis according to the present embodiment (bottom view).

The automobile model generation unit 13 generates an automobile model 61 by connecting the chassis model 51 including the suspension structure, the steering structure, and the like to a body structure model 41 to which the welding portions for welding a plurality of parts as the parts set is set in advance as illustrated in FIG. 2, the body structure model 41 being obtained by setting revolving door constituent parts 43 as equipment for door assembly or closure panels to the body structure model 31 as illustrated in FIG. 5 and FIG. 6. The body structure model 41 is connected to the chassis model 51 via the connecting points (corresponding to Nodes 1 to 12 in FIG. 4) included in the body structure model 41.

FIG. 5 and FIG. 6 illustrate an example of the body structure model 41 to which the equipment for door assembly or the closure panels are set, that is, the revolving door constituent parts 43 as closure panels are set thereto. Alternatively, the automobile model generation unit according to aspects of the present invention may generate the automobile model by using a body structure model to which mass corresponding to the equipment for door assembly or the closure panels is set.

Figure 7:
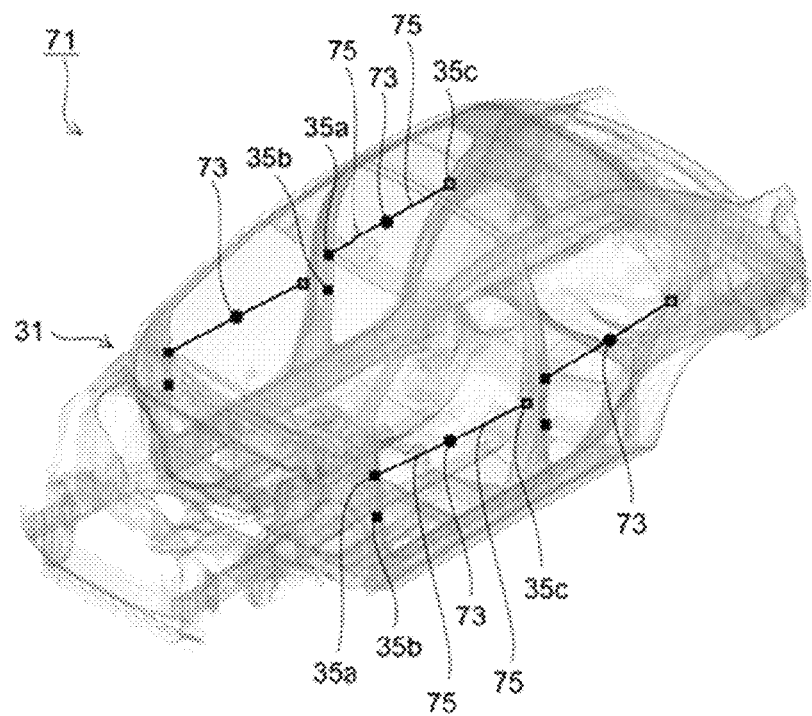
FIG. 7 is a diagram illustrating an example of the body structure model used in the present embodiment to which mass elements are set.

FIG. 7 illustrates an example of a body structure model 71 to which the mass corresponding to the equipment for door assembly or the closure panels is set. In the body structure model 71 illustrated in FIG. 7, mass elements 73 corresponding to the mass of the revolving door constituent parts 43 are set to predetermined positions in a region in which the revolving door constituent parts 43 are fixed or connected to the fixed connecting portions 35 of the body structure model 31.

The predetermined position to which the mass element 73 is set may be on a straight line connecting a pair of the fixed connecting portions 35 (the hinge 35a and the striker 35c, the hinge 35b and the striker 35c), or on a curved line connecting the fixed connecting portions 35 along the shape of the automotive body on which the closure panels and the like are mounted. In the body structure model 71 exemplified in FIG. 7, the mass element 73 is set to a middle point of the straight line connecting the hinge 35a with the striker 35c.

However, the predetermined position to which the mass corresponding to the equipment for door assembly or the closure panels is set is not limited to a position on the straight line or the curved line, and may be on a plane surrounded by the straight line or on a curved surface surrounded by the curved line except the straight line connecting the hinge 35a with the hinge 35b.

In a case in which the equipment for door assembly is fixed or connected by four fixed connecting portions set in advance to the body structure model, it is preferable to connect the fixed connecting portions with a straight line so that two straight lines intersect with each other, and set the mass element on the straight line. Also in this case, two of the four fixed connecting portions excluding a pair of hinges may be connected with a curved line following a curvature of the automotive body, and the mass element may be set on the curved line or a curved surface surrounded by the curved line.

As a specific mass setting method for setting the mass corresponding to the equipment for door assembly or the closure panels to the predetermined position of the body structure model, the following (1), (2), and (3) are exemplified.

(1) The mass elements 73 having mass corresponding to the mass of the equipment for door assembly or the closure panels are set to the predetermined positions, and the mass element 73 is connected with the fixed connecting portion 35 using a rigid element 75 (refer to FIG. 7).

Figure 8:
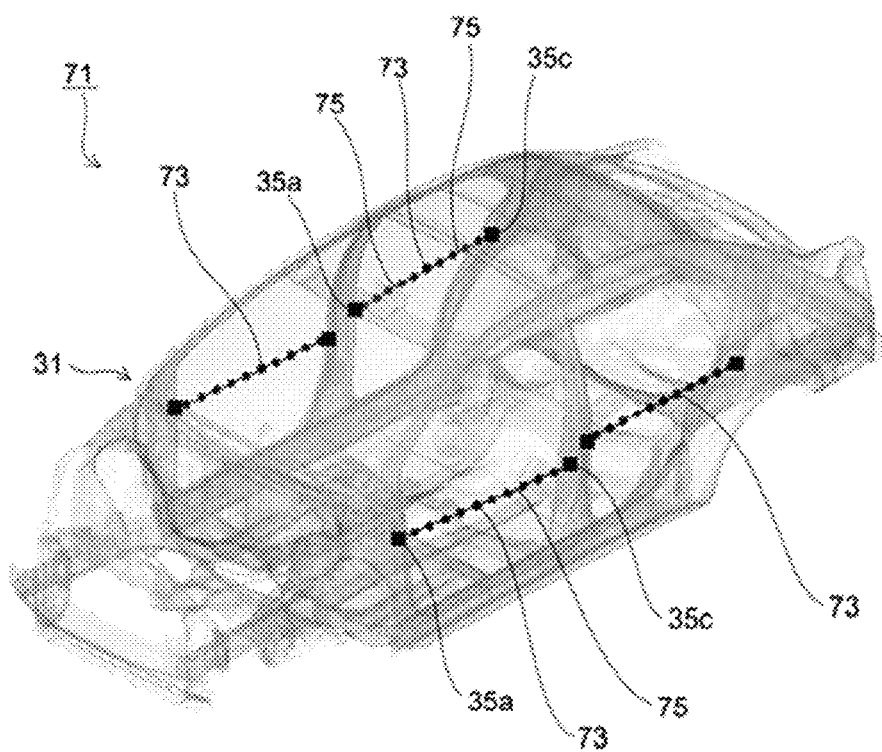
FIG. 8 is a diagram illustrating another example of the body structure model used in the present embodiment to which mass elements are set.

FIG. 7 illustrates an example of setting one mass element 73 on the center of the straight line connecting the fixed connecting portions 35, but the mass elements 73 may be set on points equally dividing the straight line as illustrated in FIG. 8. In a case of setting the mass elements 73, the mass of each of the mass elements 73 may be determined so that the sum total of the mass of the mass elements 73 corresponds to the mass of the equipment for door assembly or the closure panels.

(2) The mass element having mass corresponding to the mass of the equipment for door assembly or the closure panels is set to the predetermined position, and the mass element is connected with the fixed connecting portion using a beam element. In this case, the sum of the mass of the mass element and the beam element is set to correspond to the mass of the equipment for door assembly or the closure panels to be fixed or connected to the fixed connecting portion.

The mass of the beam element is defined based on a cross-sectional area given as a cross-section property of the beam element and an element density given as a material property. The cross-sectional area of the beam element is determined by giving a radius of the beam element, for example.

Additionally, in a case of connecting the mass element by using the beam element, the cross-section property and the material property are required to be appropriately set to the beam element, the cross-section property and the material property being required for transmitting a load caused by inertia force working on the mass element and the beam element to the body structure model in driving analysis performed by the driving analysis unit 15 described later.

The beam element is a linear element, and may be a rod element (bar element) that can transmit a tension and compression load working in an axial direction of the element. Similarly to the beam element, mass of the rod element is set based on the cross-sectional area (or the radius) given as the cross-section property and the element density given as the material property.

(3) The mass is set by using the beam element having mass corresponding to the mass of the equipment for door assembly or the closure panels.

The mass of the beam element is defined based on the cross-sectional area given as the cross-section property of the beam element and the element density given as the material property. For example, the cross-sectional area is determined by giving the radius of the beam element.

Driving Analysis Unit

The driving analysis unit 15 performs driving analysis of the automobile model 61 as an analysis object generated by the automobile model generation unit 13 so as to acquire, as a loading condition, a load and/or displacement caused at the connecting point of the body structure model 41 with respect to the chassis model 51 at the time of driving.

In the driving analysis of the automobile model 61, a driving condition for driving or steering the automobile model 61 is required to be set. Examples of the driving condition to be set include a load applied to the automobile model 61 for driving the automobile model 61, and a steering angle that is set to a steering wheel included in the chassis model 51 for steering the automobile model 61. The driving analysis unit 15 acquires a load, displacement, and the like caused at the connecting point of the body structure model 41 with respect to the chassis model 51 for the automobile model 61 running under the set driving condition.

As the driving analysis unit 15, driving analysis software for automobiles on the market can be used. In this case, the automobile model generation unit 13 can generate the automobile model by using a chassis model obtained by combining components such as a suspension included in the driving analysis software.

Adhesive Bonding Candidate Position Setting Unit

Figure 9:
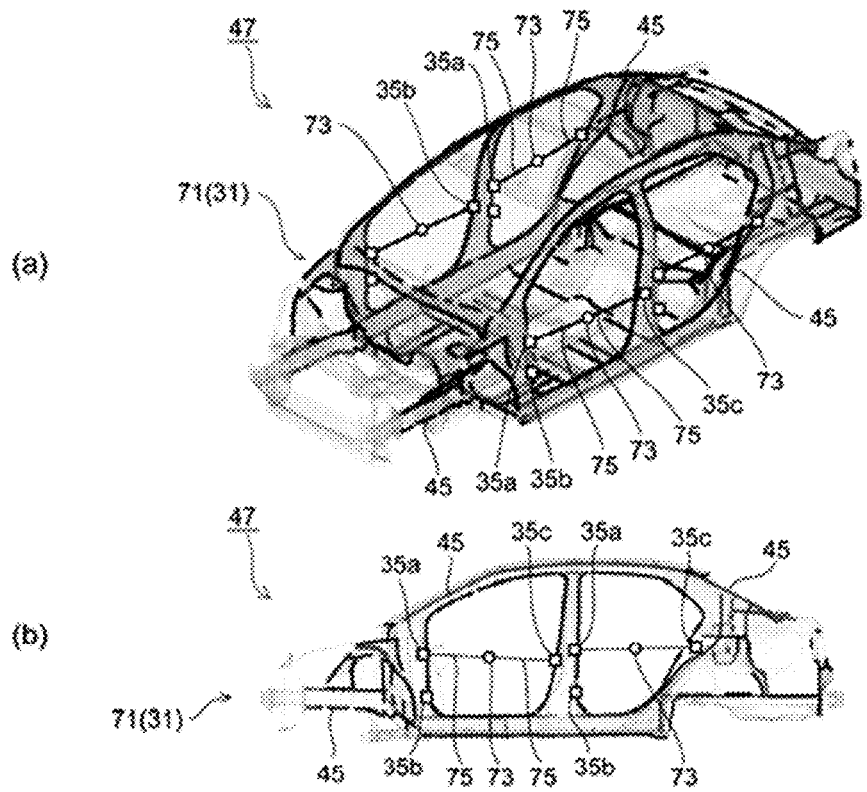
FIG. 9 is a diagram illustrating an example of disposing adhesive elements at positions as candidates at which a parts set is adhesive-bonded in the body structure model to which the mass elements are set in optimization analysis according to the present embodiment ((a): perspective view, (b): side view).

The adhesive bonding candidate position setting unit 17 disposes an adhesive element as the structural adhesive at a position as a candidate at which adhesive bonding is performed with the structural adhesive in the body structure model 31. As an example of the body structure model in which the adhesive element constituted of a three-dimensional element is disposed as the structural adhesive, FIG. 9 illustrates a body structure model 47 obtained by disposing adhesive elements 45 at positions as candidates at which adhesive bonding is performed with the structural adhesive in the body structure model 71 to which the mass elements 73 are set.

As the position as the candidate at which adhesive bonding is performed in the body structure model 47, exemplified is a portion to which a plurality of parts included in the body structure model 71 (body structure model 31) are welded as a parts set (for example, the flange portion). The adhesive elements 45 are successively disposed at positions offset from an axis of the welding portion 33 as illustrated in FIG. 10(*b*) in a parts set 37 to which the welding portions 33 are set in advance as illustrated in FIG. 10(*a*).

Figure 11:
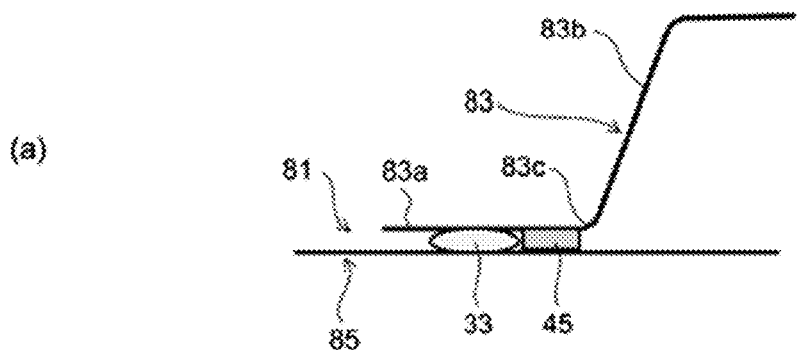
FIG. 11 is a diagram for explaining preferred arrangement of the adhesive elements as candidates at which the parts set is adhesive-bonded in the optimization analysis according to the present embodiment.
Figure 11:
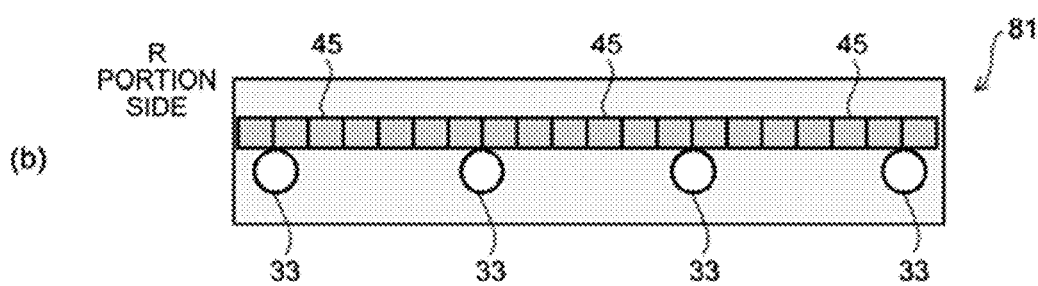

As illustrated in FIG. 11(*a*), in a case of a parts set 81 obtained by spot-welding a part 83 including a flange portion 83*a* and a side wall portion 83*b* with a part 85, mainly an R portion 83*c* in which the flange portion 83*a* and the side wall portion 83*b* are continuous tends to be deformed when a load is applied to the automotive body. Thus, in the parts set 81, it is effective to apply the structural adhesive to the R portion 83*c* side of the flange portion 83*a* for improving stiffness. Thus, in the present embodiment, as illustrated in FIG. 11(*b*), it is preferable to dispose the adhesive element 45 at a position closer to the R portion 83*c* side with respect to the welding portion 33 as the position as the candidate at which adhesive bonding is performed.

Figure 10:
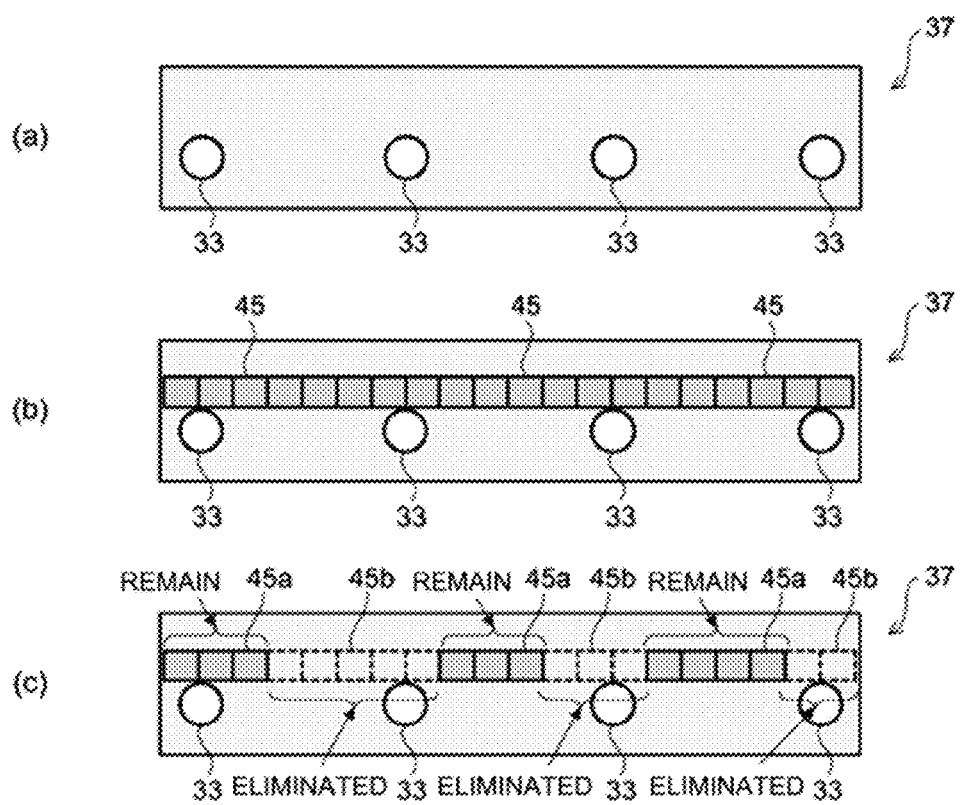
FIG. 10 is a diagram illustrating (a) the parts set to which welding portions are set in advance, (b) the adhesive elements successively disposed at the positions as candidates at which the parts set is adhesive-bonded, and (c) adhesive elements that remain while satisfying an optimization analysis condition and adhesive elements that are eliminated while not satisfying the optimization analysis condition in the optimization analysis according to the present embodiment (part 1).

FIG. 10 illustrates a case of performing adhesive bonding by applying the structural adhesive to the position offset from the axis of the welding portion 33, but the position as the candidate at which adhesive bonding is performed is not limited thereto. The adhesive elements 45 may be successively disposed on the axes of the welding portions 33 (superimposed on the welding portions 33) that are set in advance as in a parts set 39 illustrated in FIG. 12. For example, in a case of performing joining on an actual parts set using both of spot welding and the structural adhesive, if metal powder is mixed into the structural adhesive to provide electric conductivity (electric conductive) thereto, any problem is not caused in the process even when spot welding is performed along a portion to which the structural adhesive is applied.

In a case of successively disposing the adhesive elements as described above, the width and the total length of the adhesive elements, an offset distance from the welding portion, or the like may be appropriately set. In the example described above, the adhesive elements 45 are successively disposed. Alternatively, in accordance with aspects of the present invention, the adhesive elements may be disposed in a discrete manner, and in this case, the number of adhesive elements, an interval between the adhesive elements, and the like may be appropriately set.

The adhesive element is preferably constituted of a three-dimensional element, but the adhesive element is not limited to the three-dimensional element, and may be constituted of a two-dimensional element and/or a beam element.

Optimization Analysis Condition Setting Unit

The optimization analysis condition setting unit 19 sets, to the body structure model 47 (FIG. 9) in which the adhesive elements 45 are disposed, the optimization analysis condition including a loading condition to be applied to the body structure model 47 in the optimization analysis.

As the loading condition to be applied to the body structure model 47, the loading condition acquired by the driving analysis unit 15 may be given. Alternatively, in a case in which the driving analysis is not performed by the driving analysis unit 15, a load working on the automotive body at the time of driving of an actual automobile may be measured, or an estimated virtual load may be given thereto.

Furthermore, the optimization analysis condition setting unit 19 sets two types of conditions including an objective condition and a constrained condition as optimization analysis conditions for optimization analysis. The objective condition is a condition that is set depending on a purpose of the optimization analysis, and examples thereof include minimizing strain energy, maximizing absorbed energy and minimizing generated stress, and the like. The constrained condition is a constraint that is imposed to perform the optimization analysis, and examples thereof include a condition such that the body structure model 47 has predetermined stiffness, the total length of the adhesive elements disposed on the body structure model (corresponding to the application length along which the structural adhesive is applied to the parts set), and the like. A plurality of the constrained conditions can be set.

Optimization Analysis Unit

The optimization analysis unit 21 performs the optimization analysis on the adhesive element 45 in the body structure model 47, as an analysis object, to which the optimization analysis condition is set by the optimization analysis condition setting unit 19, and thereby obtains the position of the adhesive element 45 satisfying the optimization analysis condition as the position at which adhesive bonding is performed with the structural adhesive.

For example, topology optimization can be applied to the optimization analysis performed by the optimization analysis unit 21. When using a density method in the topology optimization, discretization is preferred in a case in which there are many intermediate densities. This case is represented by the following expression (1).

$$K'(\rho) = \rho^p K \qquad (1)$$

WHERE
K': STIFFNESS MATRIX OBTAINED BY IMPOSING PENALTY ON STIFFNESS MATRIX OF ELEMENT
K: STIFFNESS MATRIX OF ELEMENT
ρ: NORMALIZED DENSITY
p: PENALTY COEFFICIENT

A penalty coefficient often used for discretization is equal to or larger than 2, and a value of the penalty coefficient may be appropriately set in optimization of the adhesive bonding position according to aspects of the present invention.

By the topology optimization, an adhesive element not satisfying the optimization analysis conditions (the objective condition, the constrained condition, and the loading condition) set by the optimization analysis condition setting unit 19 is eliminated, and a significant adhesive element satisfying the optimization analysis condition remains, so that the position of the remaining adhesive element can be determined to be the position at which adhesive bonding is performed with the structural adhesive.

For example, in a case in which the optimization analysis is performed on the adhesive elements 45, as analysis objects, that are successively disposed as illustrated in FIG. 10(*b*), and adhesive elements 45*a* satisfying the optimization analysis condition remain and other adhesive elements 45*b* are eliminated as illustrated in FIG. 10(c), positions of the remaining adhesive elements 45a may be obtained as positions at which adhesive bonding is performed with the structural adhesive. Also in a case of disposing the adhesive elements 45 to be superimposed on the welding portions 33 as illustrated in FIG. 12(b), the positions of the adhesive elements 45a that remain to satisfy the optimization analysis condition may be obtained as the positions at which adhesive bonding is performed with the structural adhesive.

The optimization analysis unit 21 may perform topology optimization processing, or may perform optimization processing using another calculation scheme. As the optimization analysis unit 21, for example, analysis software using a finite element method on the market can be used.

The optimization analysis unit 21 may perform the optimization analysis while considering inertia force working on the revolving door constituent parts 43 or the mass elements 73 at the time of driving of the automobile based on an inertia relief method. The inertia relief method is an analysis method for obtaining stress or strain from force working on an object in uniformly accelerated motion in a state in which the object is supported at a supporting point as a reference of coordinates of the inertia force (free support state), and is used for static analysis of airplanes and ships in motion.

Optimization Analysis Method for Adhesive Bonding Position of Automotive Body

The following describes an optimization analysis method for the adhesive bonding position of the automotive body according to the present embodiment (hereinafter simply referred to as an "optimization analysis method").

Figure 13:
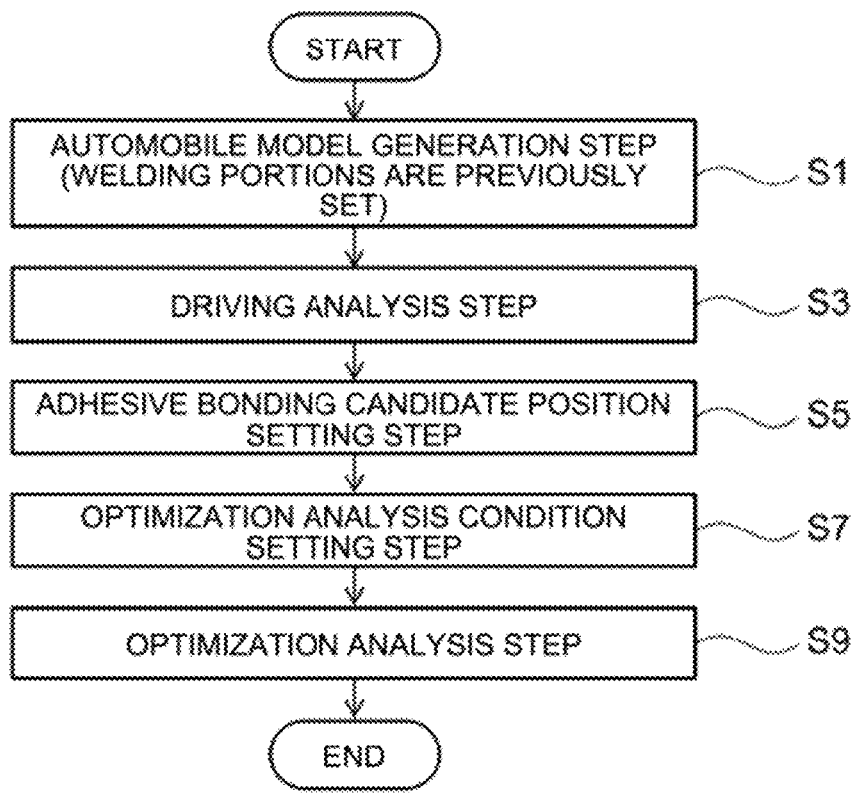
FIG. 13 is a flowchart illustrating a processing procedure of an optimization analysis method for the adhesive bonding position of the automotive body according to the embodiment of the present invention.

The optimization analysis method according to the present embodiment is a method of obtaining an optimum position at which the parts set is adhesive-bonded with the structural adhesive in combination with the welding, using the body structure model 31 including a plurality of parts constituted of a two-dimensional element and/or a three-dimensional element and having the welding portions 33 set in advance to which the parts are welded as the parts set, and includes an automobile model generation step S1, a driving analysis step S3, an adhesive bonding candidate position setting step S5, an optimization analysis condition setting step S7, and an optimization analysis step S9 as illustrated in FIG. 13. The following describes each of the steps. In the following description, each of the steps is performed by using the optimization analysis device 1 constituted of a computer.

Automobile Model Generation Step

The automobile model generation step S1 is a step of generating the automobile model 61 by connecting the body structure model 41 with the chassis model 51, the body structure model 41 to which the welding portions for welding a plurality of parts as the parts set are set in advance as illustrated in FIG. 2 and the revolving door constituent parts 43 are set as illustrated in FIG. 5, and the chassis model 51 including the suspension structure, the steering structure, and the like. The automobile model generation step S1 is performed by the automobile model generation unit 13 in the optimization analysis device 1.

A connecting position for the chassis model 51 in the body structure model 41 is a portion (connecting point) to which a suspension or a sub-frame is attached. As the connecting point in the body structure model 41, each of the connecting points set in advance to the body structure model 31 (Nodes 1 to 12 in FIG. 4) can be used.

Additionally, the body structure model 41 illustrated in FIG. 5 includes the revolving door constituent parts 43 set thereto as the closure panels. In a case in which a shape and the like of the closure panels such as the revolving door constituent parts 43 or the equipment for door assembly have been already determined, the closure panels and the equipment for door assembly are modeled to be set to the body structure model 31. However, in a case in which design of the closure panels and the shape of the equipment for door assembly are not determined yet, as illustrated in FIG. 7 described above, the body structure model 71 to which the mass elements 73 having the mass corresponding to the equipment for door assembly or the closure panels may be used.

Driving Analysis Step

The driving analysis step S3 is a step of acquiring an automotive body property at the time of driving by performing driving analysis of the automobile model 61 under a driving condition that is optionally set using the automobile model 61 generated at the automobile model generation step S1 so as to acquire, as a loading condition, a load and/or displacement caused at the connecting point of the body structure model 41 with respect to the chassis model 51 at the time of driving.

Examples of the driving condition set at the driving analysis step S3 include driving, steering, and the like of the automobile model 61. The automobile model 61 is driven by applying a load to the automobile model 61, for example, and the automobile model 61 can be caused to perform accelerated driving or constant speed driving. The automobile model 61 can be steered by controlling a steering angle of a steering wheel included in the chassis model 51 via the steering structure, for example.

Figure 14:
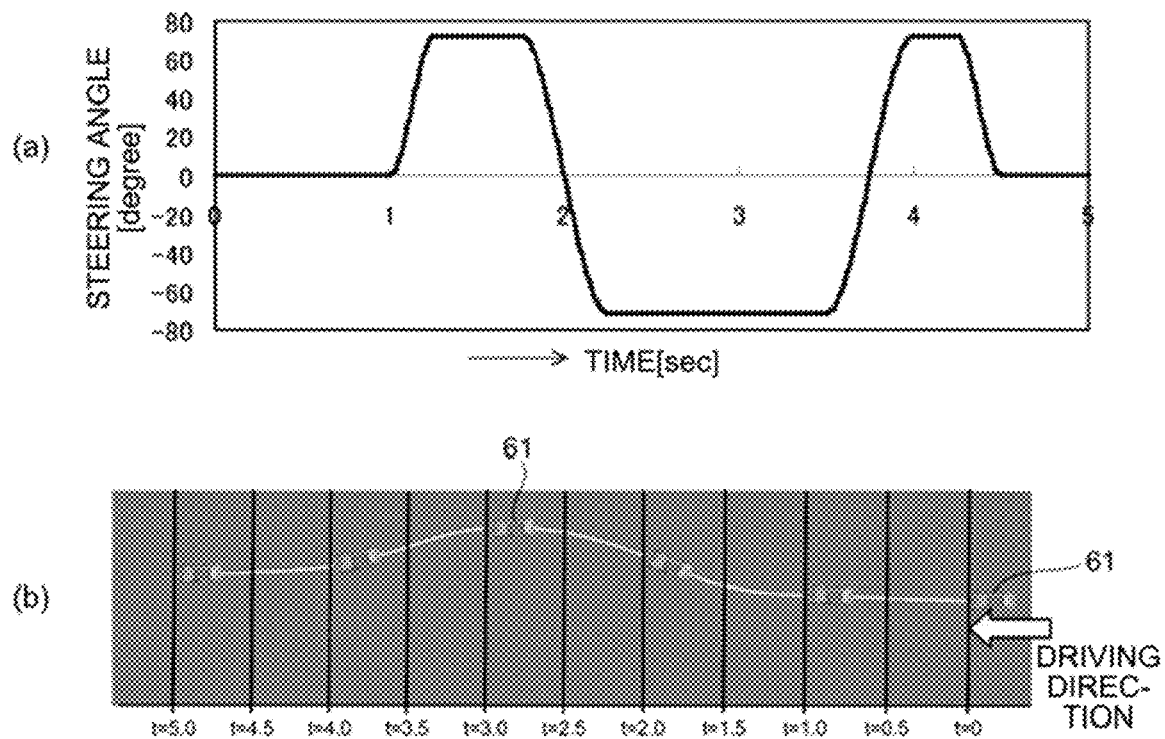
FIG. 14 is a diagram for explaining an example of a driving condition that is set at a driving analysis step of the optimization analysis method for the adhesive bonding position of the automotive body according to the present embodiment ((a): steering angle, (b): running path).

As an example of the driving condition for the driving analysis, FIG. 14 illustrates a steering angle (FIG. 14(a)) of the steering wheel in double lane change of performing lane migration successively two times during driving, and a running path (FIG. 14(b)) of the automobile model 61 when the steering angle is given.

At the driving analysis step S3, as the automotive body property of the automobile model 61 in a driving state under the set driving condition, a load and/or displacement caused at the connecting point (Nodes 1 to 12 in FIG. 4) of the body structure model 41 with respect to the chassis model 51 is acquired.

In the automobile model 61 during driving, the load caused at the connecting point of the body structure model 41 varies with behavior of the automobile. At the driving analysis step S3, the load caused at the connecting point of the body structure model 41 can be appropriately acquired based on the behavior of the automobile and a result of the load caused at each connecting point obtained by the driving analysis.

As described above, at the driving analysis step S3 according to the present embodiment, the driving analysis of the automobile is performed by using the automobile model 61 obtained by connecting the chassis model 51 with the body structure model 41 to which the equipment for door assembly or the closure panels are set, so that the load or displacement can be acquired while considering inertia force working on the equipment for door assembly or the closure panels at the time of driving.

However, the driving analysis step according to aspects of the present invention is not limited to the step of performing the driving analysis using the automobile model 61 obtained by connecting the chassis model 51 with the body structure model 41 to which the equipment for door assembly or the closure panels are set, but may be a step of performing the driving analysis by using an automobile model (not illustrated) obtained by connecting the chassis model 51 with the body structure model 71 (FIG. 7) to which the mass corresponding to the equipment for door assembly or the closure panels is set.

Adhesive Bonding Candidate Position Setting Step

The adhesive bonding candidate position setting step S5 is a step of disposing the adhesive element 45 at the position as a candidate at which the parts set is adhesive-bonded in the body structure model 31, which is performed by the adhesive bonding candidate position setting unit 17 in the optimization analysis device 1 illustrated in FIG. 1. As an example of disposing the adhesive element at the position as a candidate at which adhesive bonding is performed, FIG. 9 illustrates the body structure model 71 to which the mass elements 73 are set including the adhesive elements 45 constituted of three-dimensional elements being successively disposed.

Figure 12:
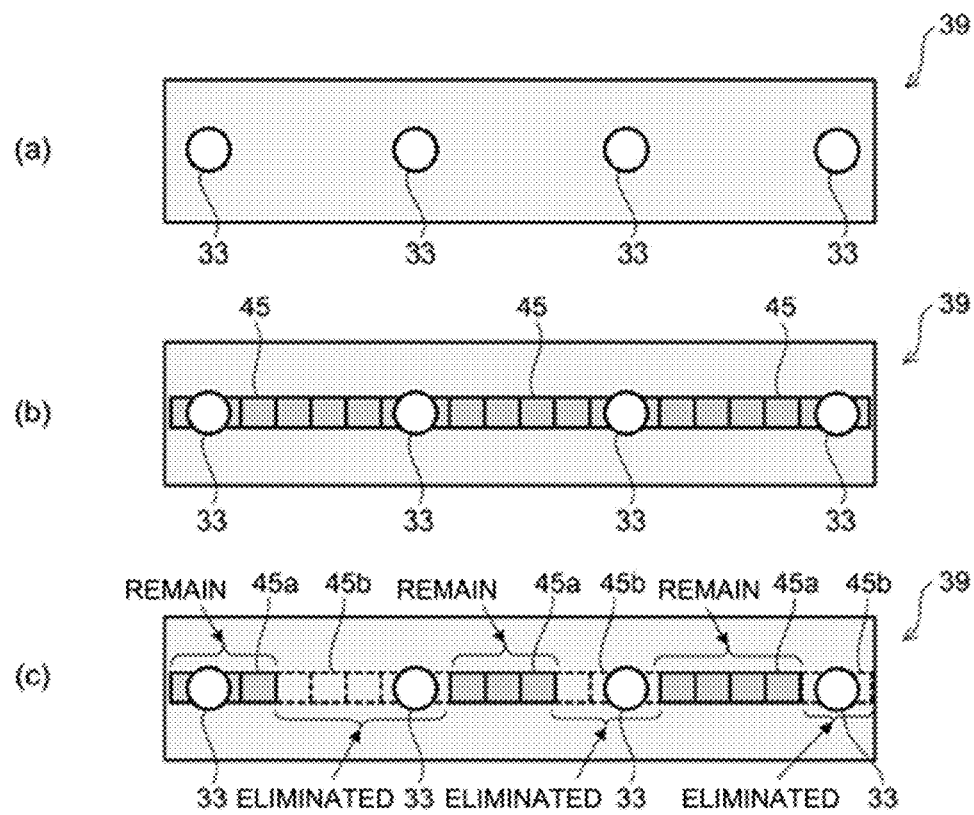
FIG. 12 is a diagram for explaining (a) the parts set to which the welding portions are set in advance, (b) the adhesive elements successively disposed at positions as candidates at which the parts set is adhesive-bonded, and (c) the adhesive elements that remain while satisfying the optimization analysis condition and the adhesive elements that are eliminated while not satisfying the optimization analysis condition in the optimization analysis according to the present embodiment (part 2).

The adhesive elements 45 disposed at the adhesive bonding candidate position setting step S5 may be successively disposed at the positions offset from the axes of the welding portions 33 set in advance to the parts set 37 as illustrated in FIG. 10 described above, or the adhesive elements 45 may be successively disposed on the axes of the welding portions 33 as illustrated in FIG. 12 described above. In this way, in a case of successively disposing the adhesive elements 45, the width of the adhesive element 45, the length of successive disposition, the offset distance from the welding portion 33, and the like may be appropriately set.

However, the adhesive bonding candidate position setting step S5 is not limited to the step of successively disposing the adhesive elements 45, and the adhesive elements 45 may be disposed in a discrete manner. In this case, the number of adhesive elements, an interval between the adhesive elements, and the like may be appropriately set.

The adhesive element is preferably constituted of a three-dimensional element, but the adhesive element is not limited to the three-dimensional element but may be constituted of a two-dimensional element.

Optimization Analysis Condition Setting Step

The optimization analysis condition setting step S7 is a step of setting, to the body structure model 31 in which the adhesive elements 45 are disposed, the optimization analysis condition including the loading condition applied to the body structure model 31 in the optimization analysis, which is performed by the optimization analysis condition setting unit 19 based on an instruction from an operator in the optimization analysis device 1.

At the optimization analysis condition setting step S7, the loading condition acquired at the driving analysis step S3 may be given as the loading condition included in the optimization analysis condition. Alternatively, in a case in which the driving analysis is not performed at the driving analysis step S3, a load working on the automotive body at the time of driving of the automobile may be measured, or an estimated virtual load may be given to the connecting point of the body structure model.

The optimization analysis conditions set at the optimization analysis condition setting step S7 include two types of conditions including the objective condition and the constrained condition, each of which is appropriately set depending on a purpose of the optimization analysis.

Optimization Analysis Step

The optimization analysis step S9 is a step of performing the optimization analysis on the body structure model 31 (refer to FIG. 9) in which the adhesive elements 45 are disposed at the positions as the candidates at which adhesive bonding is performed at the adhesive bonding candidate position setting step S5, obtaining the adhesive element 45 satisfying the optimization analysis condition that is set at the optimization analysis condition setting step S7, and causing the position of the obtained adhesive element 45 to be the position at which adhesive bonding is performed with the structural adhesive, which is performed by the optimization analysis unit 21 in the optimization analysis device 1.

For example, in the parts set 37 illustrated in FIG. 10, when the optimization analysis is performed on the adhesive elements 45 set to the parts set 37 at the optimization analysis step S9, as illustrated in FIG. 10(c), the adhesive elements 45a satisfying the optimization analysis condition remain, and the adhesive elements 45b not satisfying the optimization analysis condition are eliminated in the process of the optimization analysis. Due to this, the positions of the remaining adhesive elements 45a can be obtained as the positions at which adhesive bonding is performed with the structural adhesive.

The topology optimization can be applied to the optimization analysis performed at the optimization analysis step S9. In a case of applying a density method to the topology optimization, discretization is preferably performed while setting the penalty coefficient of the element to be equal to or larger than 4.

In the optimization analysis, the inertia force working on the equipment for door assembly or the closure panels at the time of driving of the automobile may be considered by using the inertia relief method.

With the automotive body adhesive bonding position optimization analysis method and optimization analysis device according to the present embodiment, it is possible to accurately obtain the optimum position at which adhesive bonding is performed with the structural adhesive for improving the stiffness of the automobile at the time of driving by performing the driving analysis using the automobile model obtained by connecting the chassis model with the body structure model to which the welding portions for welding the parts as the parts set are set in advance, acquiring the loading condition that is generated at the connecting point of the body structure model with respect to the chassis model at the time of driving by the driving analysis, disposing the adhesive element as the structural adhesive at the position as the candidate at which adhesive bonding is performed with the structural adhesive, and giving the loading condition generated at the connecting point acquired by the driving analysis to perform the optimization analysis on the adhesive element as an analysis object of the optimization.

The automotive body adhesive bonding position optimization analysis method and optimization analysis device according to aspects of the present invention are not limited to the method and the device that set the equipment for door assembly or the closure panels or set the mass elements corresponding to the equipment for door assembly or the closure panels in the driving analysis, and dispose the adhesive element in the body structure model to which the equipment for door assembly, the closure panels, or the mass elements are set in the optimization analysis. That is, in the optimization analysis, the body structure model to which the equipment for door assembly or the closure panels are set or the body structure model to which the mass corresponding to the equipment for door assembly or the closure panels is not necessarily required to be used, but the adhesive elements may be disposed in the body structure model to which the equipment for door assembly, the closure panels, or the mass corresponding to the equipment for door assembly or the closure panels is not set to perform the optimization analysis. However, in a case of performing the optimization analysis using the body structure model to which the equipment for door assembly, the closure panels, or the mass corresponding to the equipment for door assembly or the closure panels is not set, the loading condition acquired by the driving analysis is given as the optimization analysis condition.

For the automotive body adhesive bonding position optimization analysis method and optimization analysis device according to aspects of the present invention, the body structure model to which the equipment for door assembly, the closure panels, or the mass corresponding to the equipment for door assembly or the closure panels is not set may be used in the optimization analysis so long as the loading condition is acquired by setting the equipment for door assembly or the closure panels, or setting the mass corresponding to the equipment for door assembly or the closure panels in the driving analysis, and the acquired loading condition is given as the optimization analysis condition.

In the above description, the load acquired by the driving analysis is given as the loading condition, but according to aspects of the present invention, the optimization analysis may be performed by measuring the load working on the body structure model at the time of driving of the automobile without performing the driving analysis, or giving a virtual loading condition.

Figure 15:
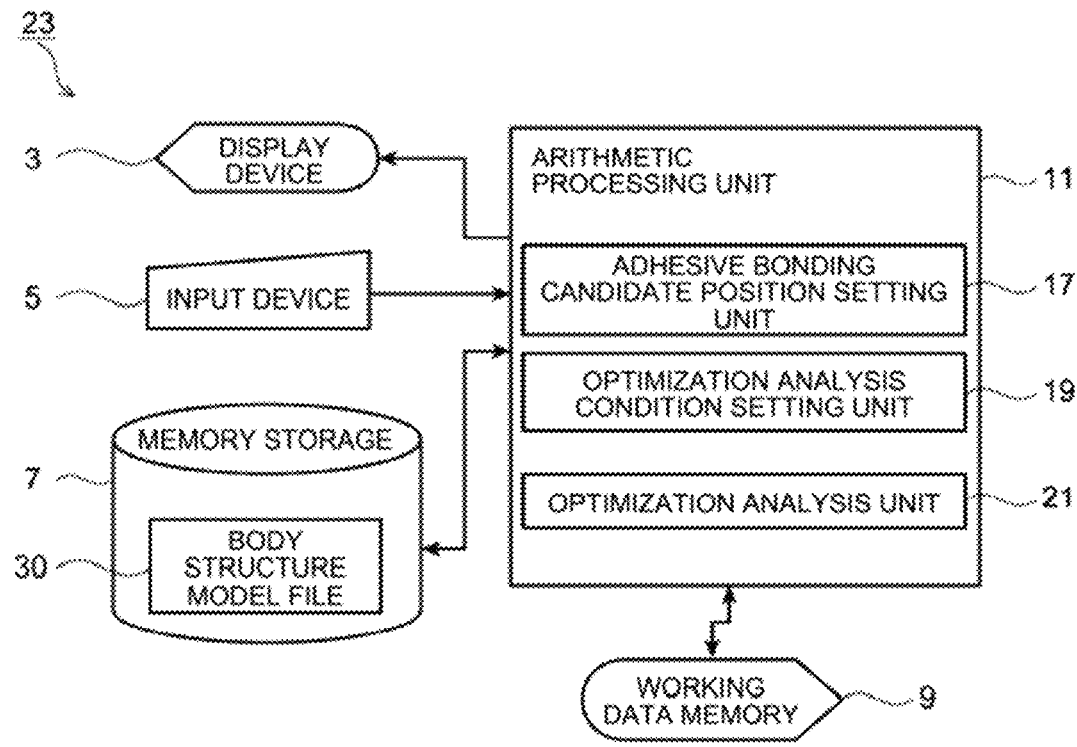
FIG. 15 is a block diagram illustrating another aspect of the optimization analysis device for the adhesive bonding position of the automotive body according to aspects of the present invention.
Figure 16:
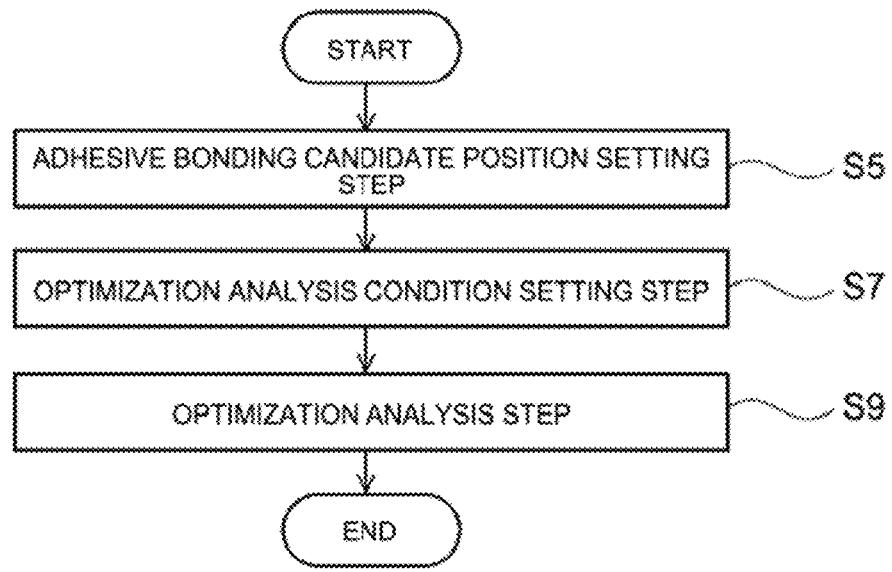
FIG. 16 is a flowchart illustrating another aspect of the optimization analysis method for the adhesive bonding position of the automotive body according to aspects of the present invention.

In this case, as the optimization analysis device for the adhesive bonding position of the automotive body according to another embodiment of the present invention, as illustrated in FIG. 15, an optimization analysis device 23 including the adhesive bonding candidate position setting unit 17, the optimization analysis condition setting unit 19, and the optimization analysis unit 21 can be exemplified. Similarly, as the optimization analysis method for the adhesive bonding position of the automotive body according to another embodiment of the present invention, as illustrated in FIG. 16, a method including the adhesive bonding candidate position setting step S5, the optimization analysis condition setting step S7, and the optimization analysis step S9 can be exemplified. A specific example of the virtual loading condition given in the optimization analysis will be explained in an example described later.

Additionally, the automotive body adhesive bonding position optimization analysis method and optimization analysis device according to aspects of the present invention can be applied to a case of obtaining an optimum position at which adhesive bonding is performed with the structural adhesive in combination with spot welding, or continuous welding such as laser welding or arc welding. As the structural adhesive, an adhesive having a Young's modulus of 2 to 4 GPa can be preferably used.

EXAMPLE

The following describes an experiment that has been performed to confirm the effects according to aspects of the present invention. In the experiment, first, the mass elements 73 corresponding to the revolving door constituent parts 43 were set at predetermined positions in a region in which the revolving door constituent parts as the closure panels were fixed or connected to the body structure model 31 as illustrated in FIG. 8 by using the body structure model 31 illustrated in FIG. 2 to FIG. 4.

The body structure model 31 used in the present example includes the welding portions 33 (refer to FIG. 2) disposed at the portions for welding the parts as the parts set, the fixed connecting portions 35 (refer to FIG. 3) for fixing or connecting the equipment for door assembly or the closure panels, and the connecting points (Nodes 1 to 12 in FIG. 4) to be connected to the chassis model 51 (refer to FIG. 5) including the suspension structure and the like. The mass of the body structure model 31 was about 300 kg while the mass of the four revolving door constituent parts 43 was about 79 kg.

Thus, as illustrated in FIG. 8, a body structure model 77 to which the mass corresponding to the revolving door constituent parts was set was generated by equally disposing the ten mass elements 73 on a straight line connecting the hinge 35a with the striker 35c on an upper side, and connecting the mass elements 73, the mass element 73 and the hinge 35a, and the mass element 73 and the striker 35c with each other with the rigid element 75. The mass of the mass elements 73 were set so that the sum total thereof was equal to the mass of the revolving door constituent parts.

Next, as illustrated in FIG. 5, the automobile model 61 was generated by connecting the body structure model 77 with the chassis model 51, and the driving analysis was performed. In generating the automobile model 61, the body structure model 77 was connected with the chassis model 51 via the connecting points (FIG. 4, Nodes 1 to 12) that were set in advance to the body structure model 31.

The driving condition for the automobile model 61 in the driving analysis was assumed to be double lane change illustrated in FIG. 14. That is, a load was applied to the automobile model 61 to be accelerated up to 50 km/h in 1.0 sec from the time when driving was started, and constant speed driving was performed thereafter without acceleration. Subsequently, a simulation was performed such that a steering angle for lane change was given as illustrated in FIG. 14, a steering wheel was started to be turned to change a lane at the time of 1.0 sec, and the automobile model 61 returned to an original lane at the time of 5.0 sec.

Through the driving analysis under the driving condition described above, a load that was generated at the connecting points (Nodes 1 to 12) of the body structure model 77 and the chassis model 51 at the time of driving of the automobile model 61 was acquired.

Figure 17:
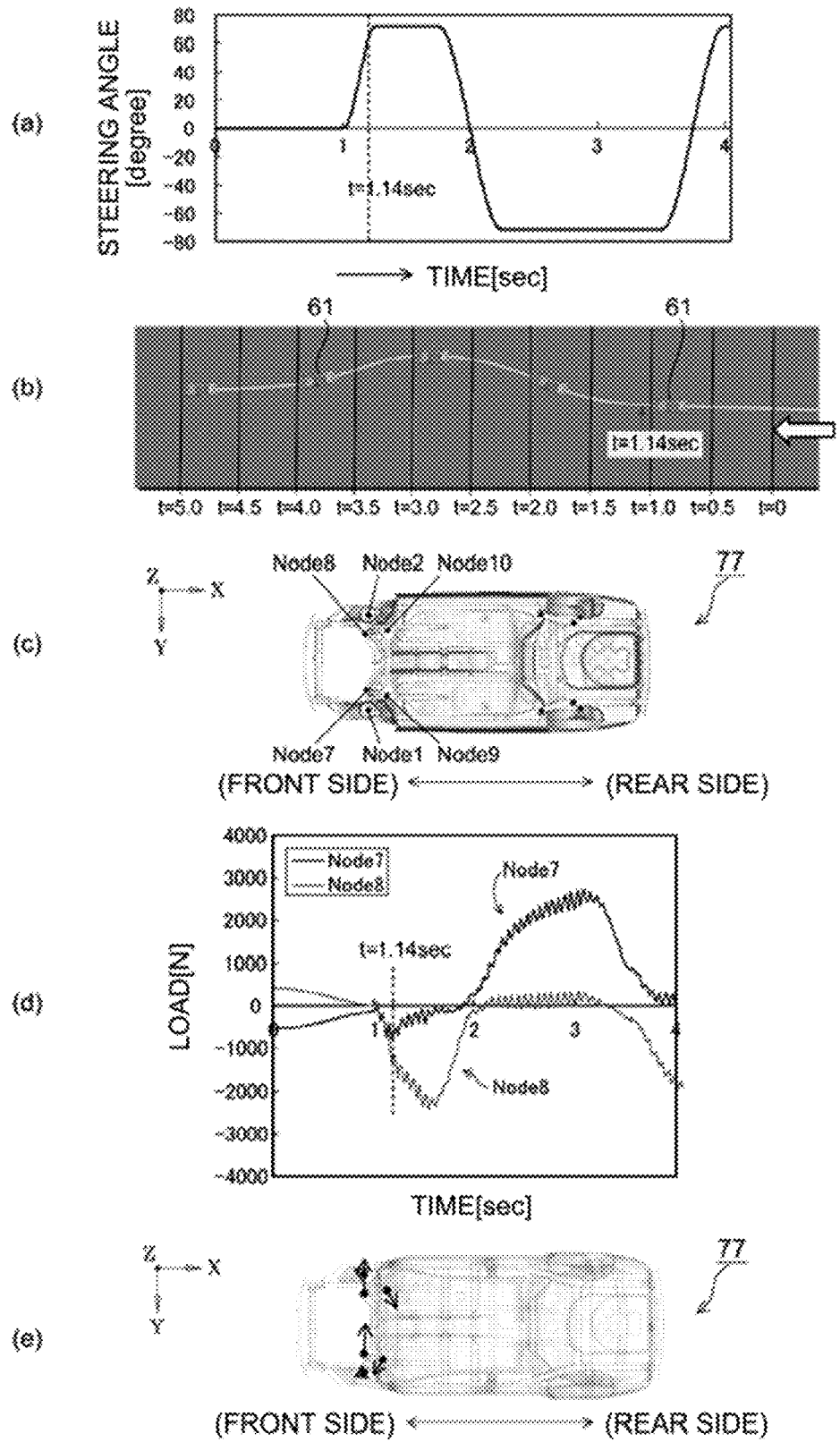
FIG. 17 is a diagram illustrating a steering angle set as a driving condition for driving analysis and a running path of the automobile model, and a result of a load generated at the connecting point on a front side of the body structure model acquired by driving analysis in an example ((a): steering angle, (b): running path, (c): position of the connecting point, (d): temporal change of the load generated at the connecting point, (e): magnitude and a direction of the load generated at the connecting point).

FIG. 17 illustrates a result of loads generated at the connecting points (Nodes 1, 2, and 7 to 10) on a front side of the automobile that were acquired by the driving analysis. FIG. 17(a) illustrates a steering angle of steering in the driving analysis, FIG. 17(b) illustrates a running path of the automobile model 61, FIG. 17(c) illustrates the positions of the connecting points (Nodes 1, 2, and 7 to 10) on the front side from which the loads were acquired, FIG. 17(d) illustrates temporal change of the loads in the Y-direction (automobile width direction) generated at the Nodes 7 and 8 among the connecting points, and FIG. 17(e) illustrates orientation and magnitude of the load generated at each of the connecting points at the time when t=1.14 sec had elapsed from the time when the driving was started.

Figure 18:
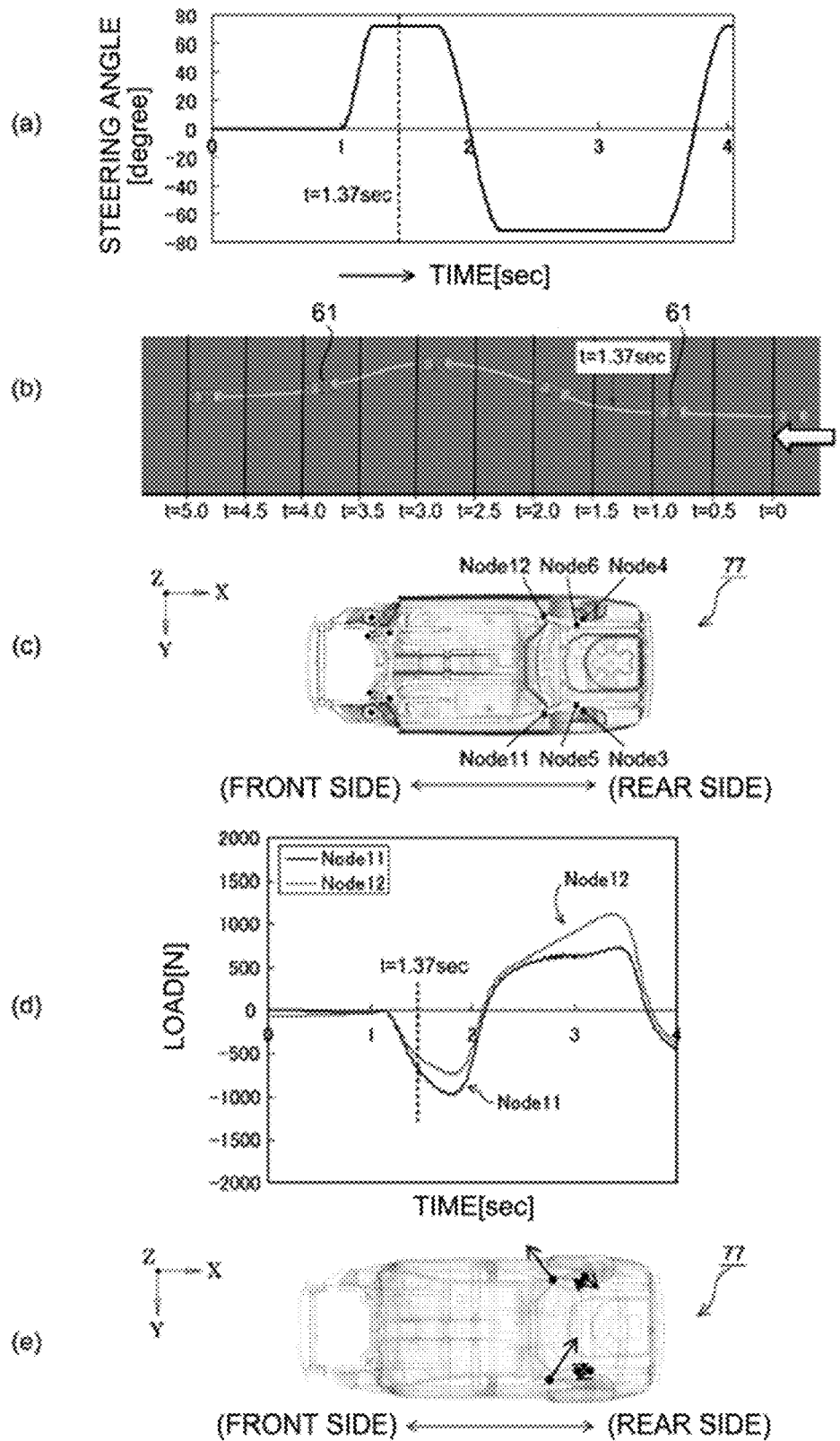
FIG. 18 is a diagram illustrating a steering angle set as a driving condition for driving analysis and a running path of the automobile model, and a result of a load generated at the connecting point on a rear side of the body structure model acquired by driving analysis in the example ((a): steering angle, (b): running path, (c): position of the connecting point, (d): temporal change of the load generated at the connecting point, (e): magnitude and a direction of the load generated at the connecting point).

FIG. 18 illustrates the loads at the connecting points (Nodes 3 to 6, 11, and 12) on a rear side of the automobile that were acquired by the driving analysis. FIG. 18(a) illustrates a steering angle of steering in the driving analysis, FIG. 18(b) illustrates a running path of the automobile model 61, FIG. 18(c) illustrates the positions of the connecting points (Nodes 3 to 6, 11, and 12) on the rear side from which the load was acquired, FIG. 18(d) illustrates temporal change of the load in the Y-direction (automobile width direction) generated at the Nodes 11 and 12 among the connecting points, and FIG. 18(e) illustrates orientation and magnitude of the load generated at each connecting point at the time when t=1.37 sec had elapsed from the time when the driving was started.

A difference is found in the loads generated at the respective connecting points with reference to FIG. 17 and FIG. 18 (FIG. 17(d) and FIG. 18(d)), and the orientation and the magnitude of the load is different for each position of the connecting point (FIG. 17(e) and FIG. 18(e)).

In the present example, as the load generated at the connecting point at the time of driving, it was specified a load at the time when t=1.14 sec had elapsed from the time when driving was started for the connecting points (Nodes 1, 2, and 7 to 10) on the front side (FIG. 17), and a load at the time when t=1.37 sec had elapsed from the time when driving was started for the connecting points (Nodes 3 to 6, 11, and 12) on the rear side (FIG. 18).

The elapsed time for specifying the load described above was assumed to be immediately after the steering wheel was started to be turned in the driving analysis, and slightly longer time was assumed for the rear side as compared with the front side. However, the time for specifying the load can be appropriately selected based on the behavior of the automobile and the result of the load generated at each connecting point in the driving analysis.

Figure 19:
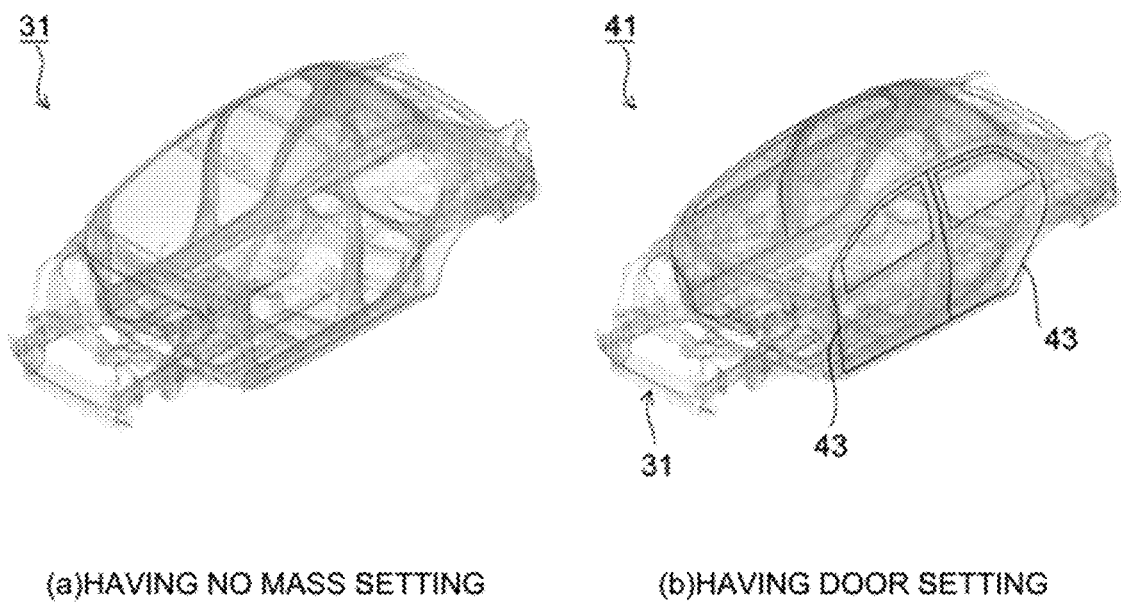
FIG. 19 is a diagram illustrating the body structure model as an analysis object in the example ((a): revolving door constituent parts or mass corresponding to the revolving door constituent parts is not set, (b) the revolving door constituent parts are set).

In the present example, the chassis model 51 was connected with each of the body structure model 31 to which the mass of the revolving door constituent parts was not set (FIG. 19(a)) and the body structure model 41 to which the revolving door constituent parts 43 were set (FIG. 19(b)) to generate the automobile model and perform the driving analysis similarly to the body structure model 77 to which the mass elements 73 were set (FIG. 8), and the loads generated at the connecting points with respect to the chassis model 51 were acquired.

Figure 20:
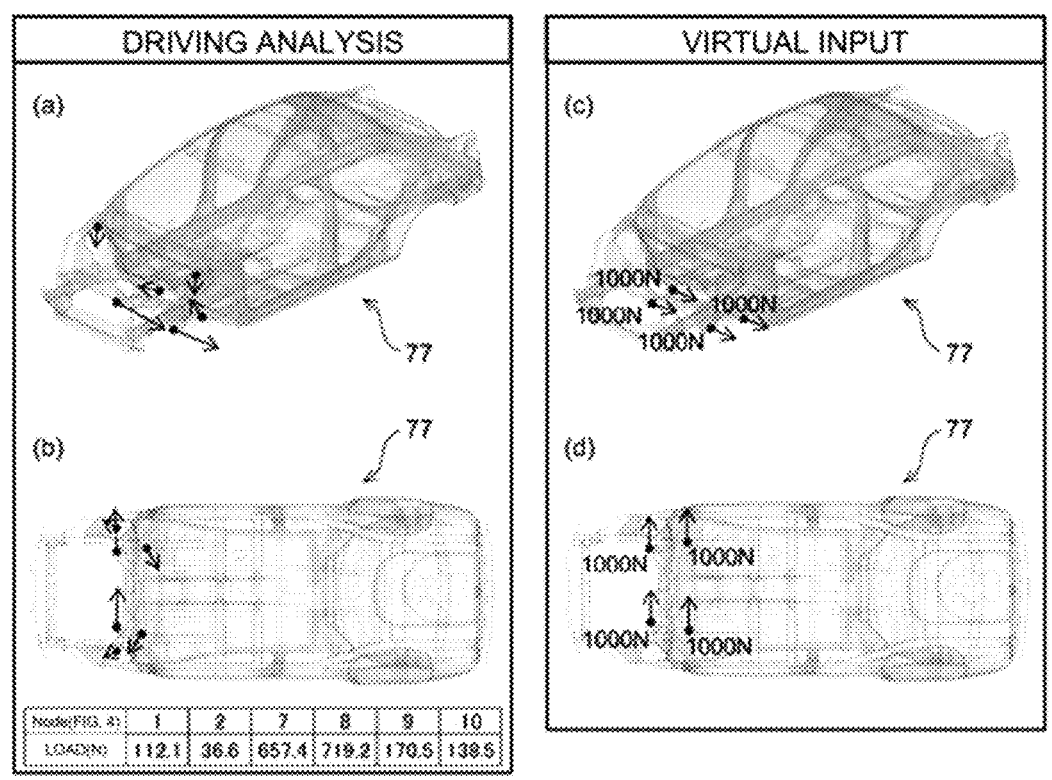
FIG. 20 is a diagram for explaining a loading condition given to the body structure model as the optimization analysis condition in the example (a connecting point on the front side).

FIGS. 20(a) and 20(b) illustrate the orientation and the magnitude of the loads (FIG. 17(e)) generated at the connecting points (Nodes 1, 2, and 7 to 10) on the front side acquired by the driving analysis using the body structure model 77 to which the mass elements 73 are set, and values of the loads at the respective connecting points are illustrated in FIG. 20(b).

Figure 21:
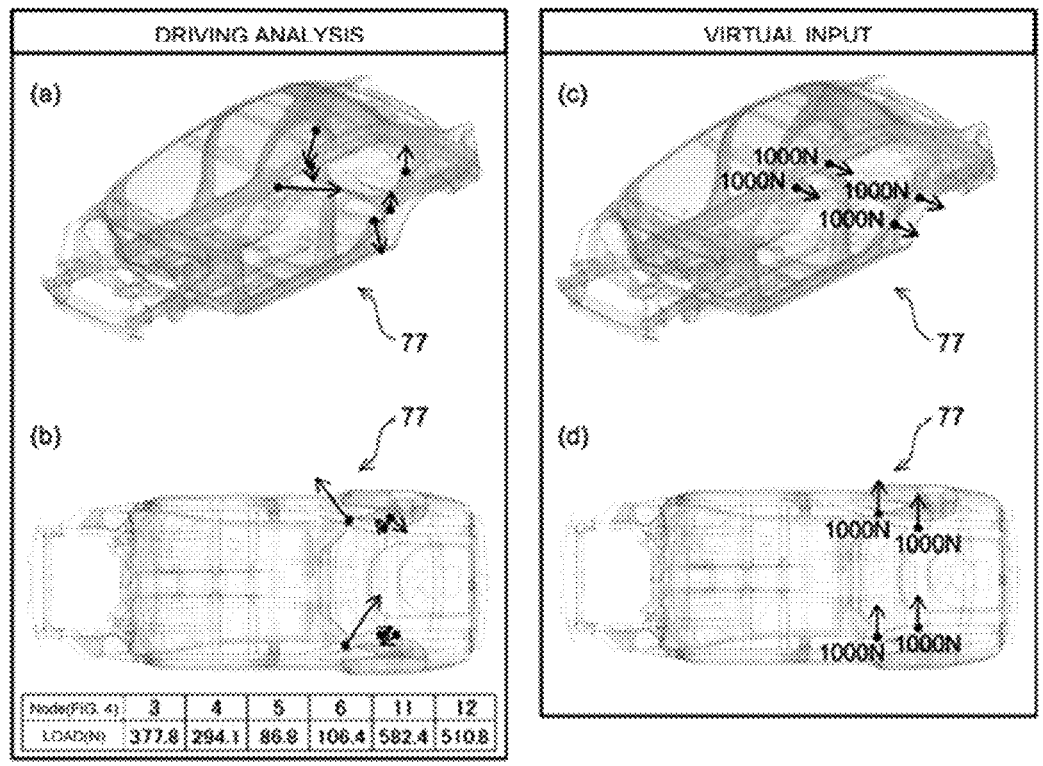
FIG. 21 is a diagram for explaining a loading condition given to the body structure model as the optimization analysis condition in the example (a connecting point on the rear side).

FIGS. 21(a) and 21(b) illustrate the orientation and the magnitude of the loads (FIG. 18(e)) generated at the connecting points (Nodes 3 to 6, 11, and 12) on the rear side acquired by the driving analysis using the body structure model 77 to which the mass elements 73 are set, and the magnitude of the load at each of the connecting points is illustrated in FIG. 21(b).

In the present example, the driving analysis was not performed, and the optimization analysis of the adhesive bonding position was performed by giving virtual loads assuming lane change to the connecting points of the body structure model 77 to which the mass elements 73 were set, and a difference in the loading condition for the optimization analysis was examined. FIGS. 20(c) and 20(d) illustrate the orientation and the magnitude of the virtual loads given to the connecting points (Nodes 1, 2, and 7 to 10) on the front side of the body structure model 77 to which the mass elements 73 were set, and a uniform load (=1000 N) was given in the same direction (Y-direction) to each of the connecting points. FIGS. 21(c) and 21(d) illustrate the orientation and the magnitude of the virtual loads given to the connecting points (Nodes 3 to 6, 11, and 12) on the rear side of the body structure model 77 to which the mass elements 73 were set, and a uniform load (=1000 N) was given in the same direction (Y-direction) to each of the connecting points.

Next, FIG. 22 to FIG. 25 illustrate an analysis result of body deformation at the time when the load acquired by the driving analysis is given to the connecting point of the body structure model as the loading condition.

Figure 22:
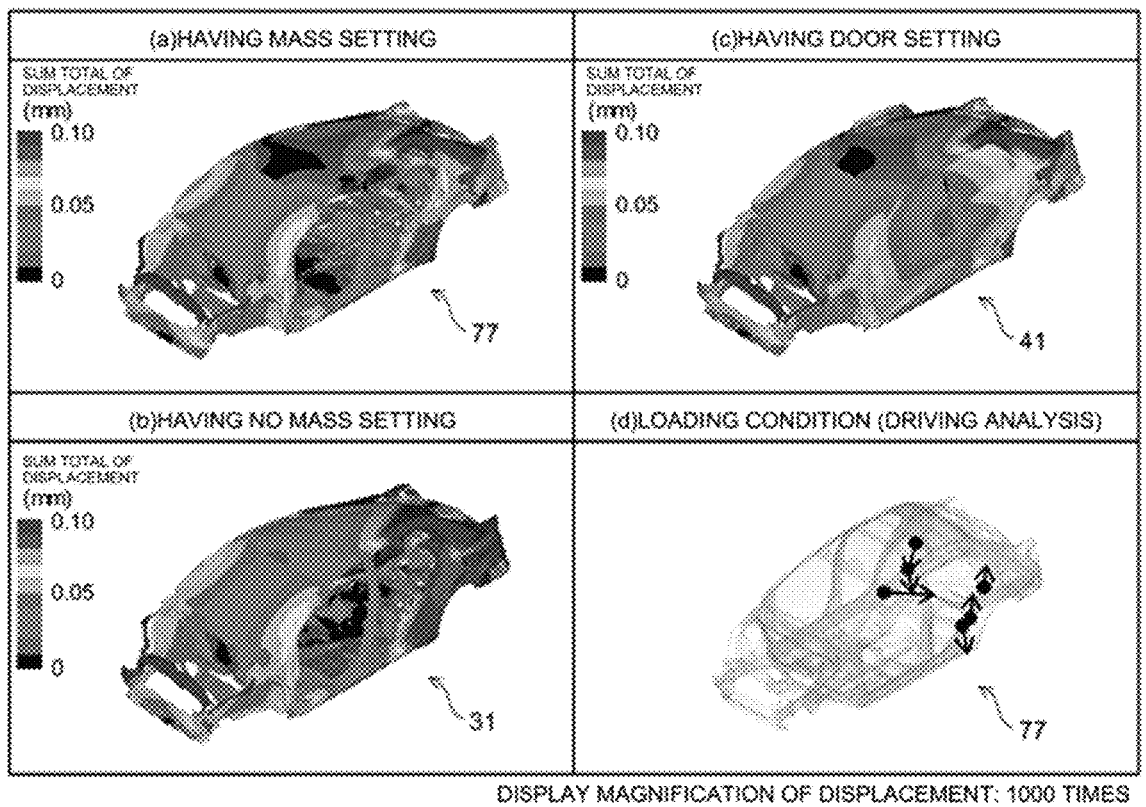
FIG. 22 is a diagram illustrating an analysis result of body deformation in a case of giving the loading condition acquired by driving analysis in the example (part 1).
Figure 23:
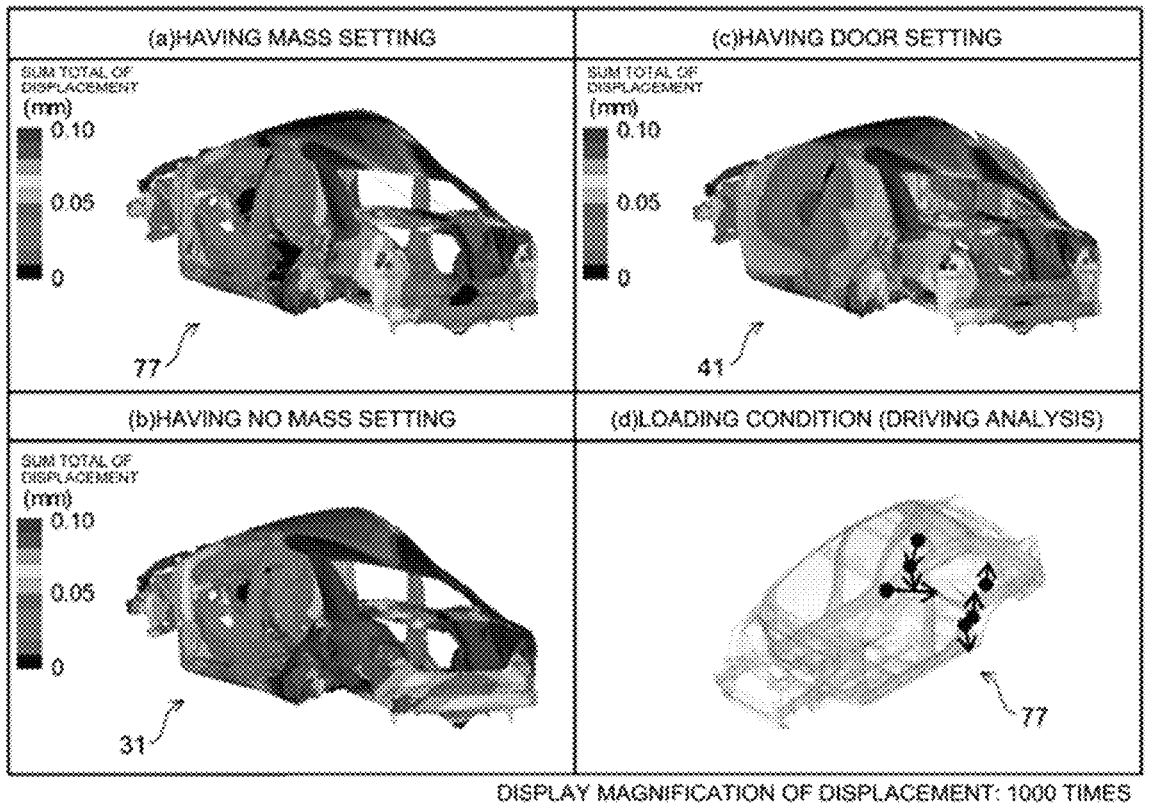
FIG. 23 is a diagram illustrating an analysis result of body deformation in a case of giving the loading condition acquired by driving analysis in the example (part 2).

FIG. 22 and FIG. 23 illustrate the analysis result of body deformation at the time when the loading condition acquired by the driving analysis is given to the connecting point on the rear side. In FIG. 22 and FIG. 23, (a) to (c) represent analysis results of a displacement amount of the automotive body, (a) represents the result for the body structure model 77 to which the mass elements 73 having the mass corresponding to the revolving door constituent parts 43 are set (having a mass setting), (b) represents the result for the body structure model 31 to which the mass of the revolving door constituent parts 43 is not set (having no mass setting), (c) represents the result for the body structure model 41 to which the revolving door constituent parts 43 are set (having a door setting), and (d) represents the orientation and the magnitude of the loads at the connecting point on the rear side acquired by the driving analysis. FIG. 22 illustrates the automotive body viewed from a front left side, and FIG. 23 illustrates the automotive body viewed from a rear left side. Both of FIG. 22 and FIG. 23 illustrate the displacement amount of the automotive body magnified by 1000 times.

The displacement amount of the automotive body in the body structure model 31 to which the mass is not set (FIG. 22(b), FIG. 23(b)) was different in some degree from that in the body structure model 77 having the mass setting (FIG. 22(a), FIG. 23(a)) and the body structure model 41 having the door setting (FIG. 22(c), FIG. 23(c)) in a portion that was largely displaced (roof portion and the like), but displacement of the entire automotive body shows similar inclinations.

Figure 24:
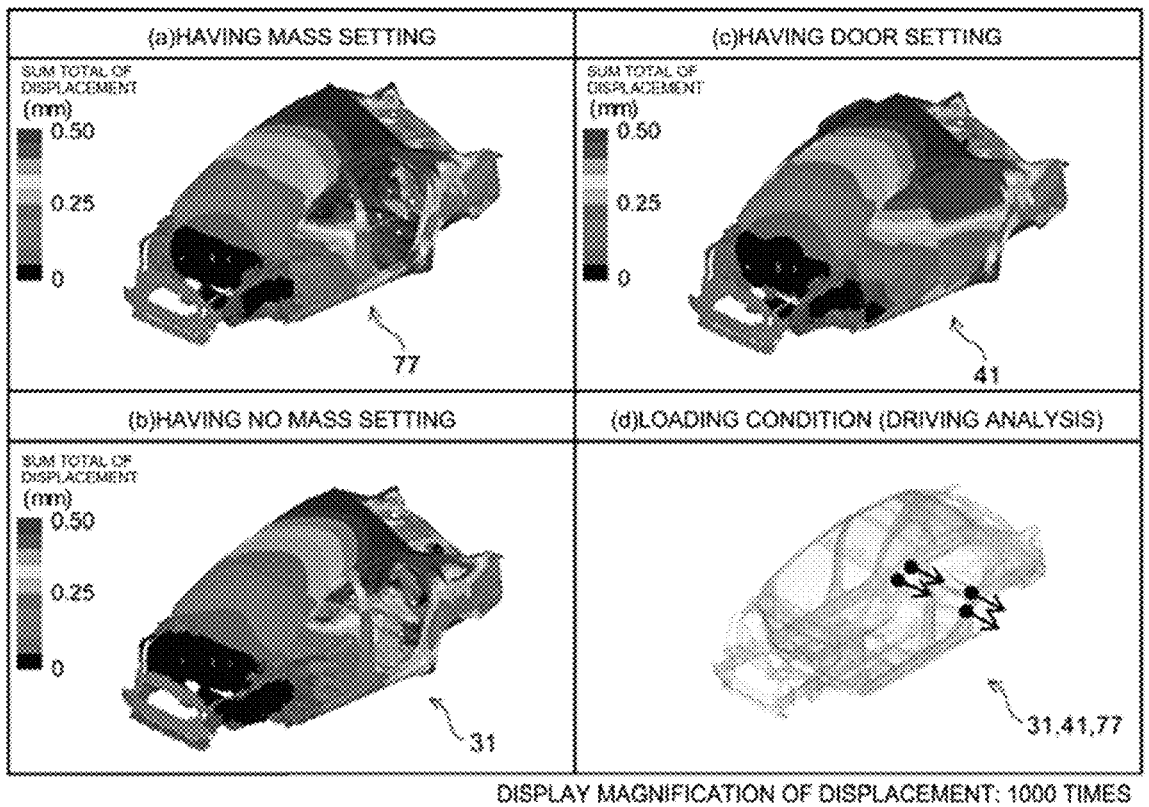
FIG. 24 is a diagram illustrating an analysis result of body deformation in a case of giving a virtual loading condition in the example (part 1).
Figure 25:
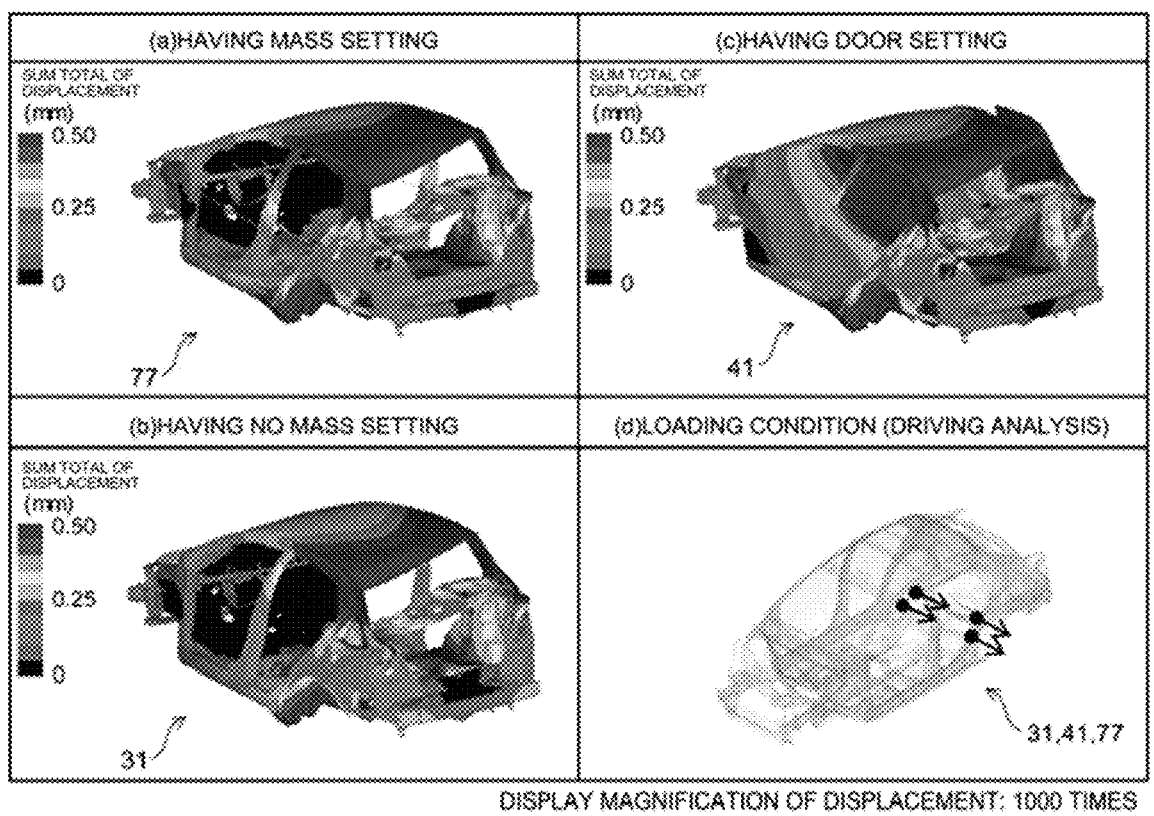
FIG. 25 is a diagram illustrating an analysis result of body deformation in a case of giving a virtual loading condition in the example (part 2).
Figure 26:
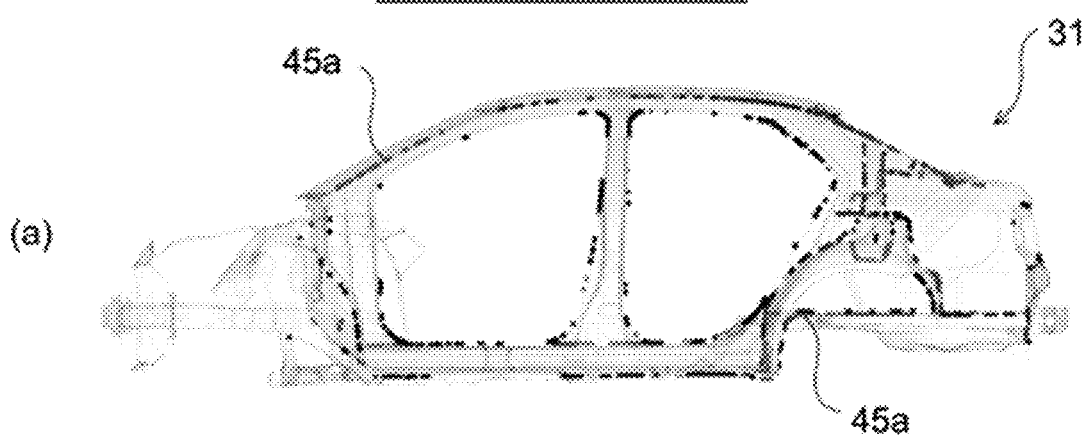
FIG. 26 is a diagram illustrating adhesive elements that are obtained by giving the loading condition acquired by driving analysis and performing optimization analysis on the adhesive elements as analysis objects disposed in the body structure model to which mass is not set in the example.
Figure 26:
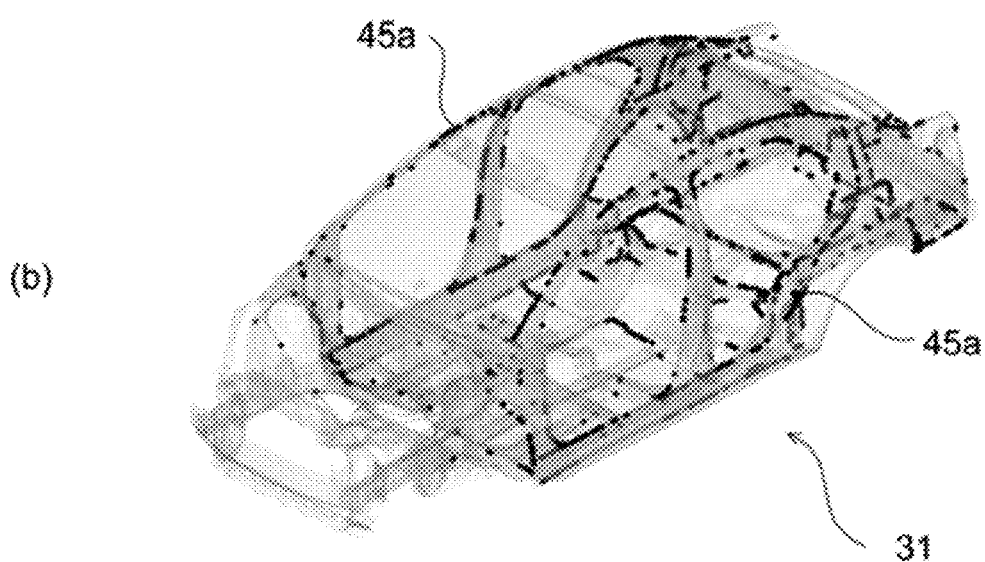
Figure 26:
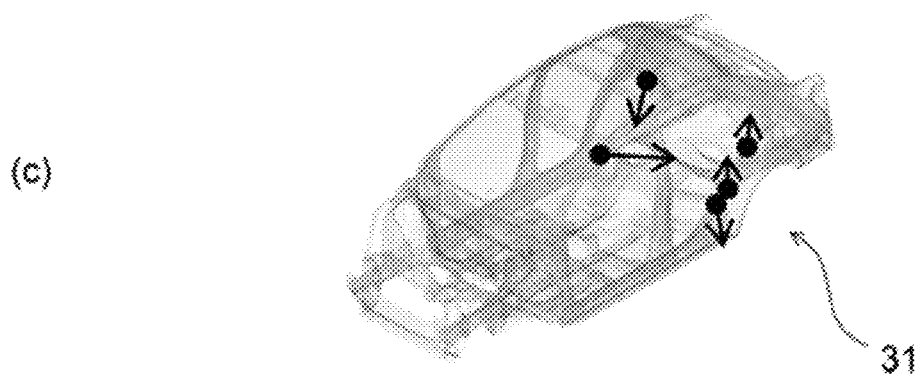
Figure 27:
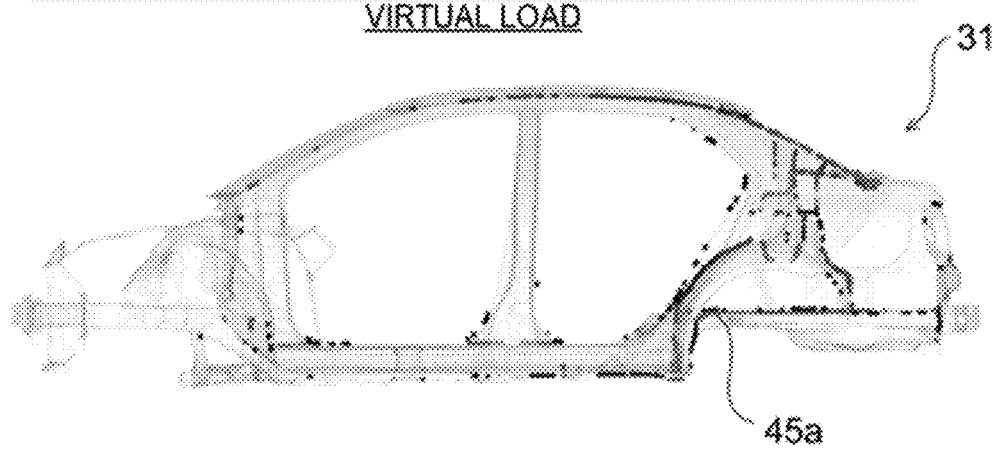
FIG. 27 is a diagram illustrating adhesive elements that are obtained by giving a virtual loading condition and performing optimization analysis on the adhesive elements as analysis objects disposed in the body structure model to which mass is not set in the example.
Figure 27:
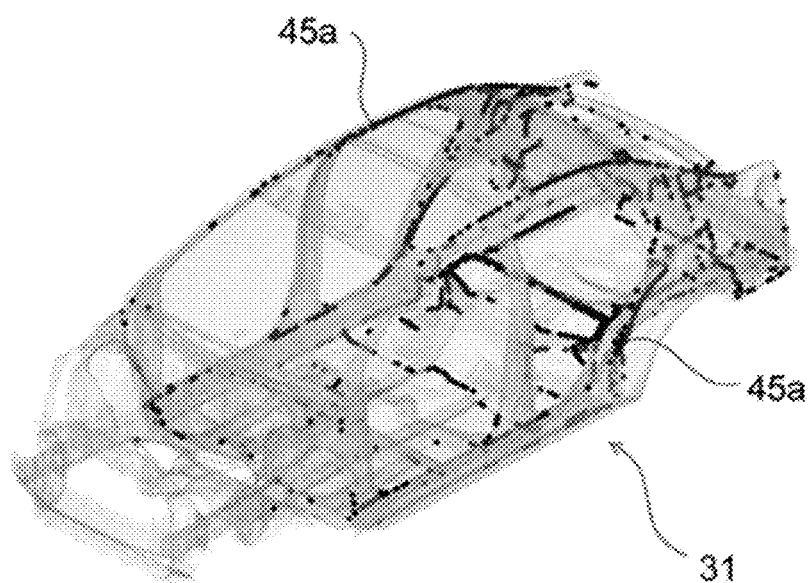
Figure 27:
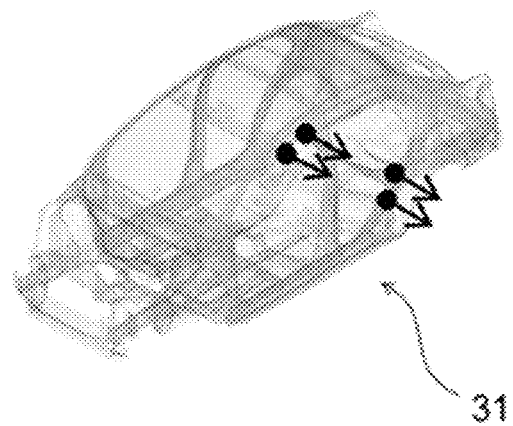

FIG. 24 and FIG. 25 illustrate an analysis result of body deformation at the time when a virtual loading condition assuming lane change is given to the connecting point on the rear side.

Similarly to FIG. 22 and FIG. 23, in FIG. 24 and FIG. 25, (a) to (c) represent the analysis results of the displacement amount of the automotive body, (a) represents the result for the body structure model 77 to which the mass elements 73 having the mass corresponding to the revolving door constituent parts 43 are set (having the mass setting), (b) represents the result for the body structure model 31 to which the mass of the revolving door constituent parts 43 is not set (having no mass setting), (c) represents the result for the body structure model 41 to which the revolving door constituent parts 43 are set (having the door setting), and (d) represents the orientation and the magnitude of the virtual load given to the connecting point on the rear side. FIG. 24 illustrates the automotive body viewed from a front left side, and FIG. 25 illustrates the automotive body viewed from a rear left side. Both of FIG. 24 and FIG. 25 illustrate the displacement amount of the automotive body magnified by 1000 times.

Also in a case of inputting the virtual load, the displacement amount of the automotive body in the body structure model 31 having no mass setting (FIG. 24(b), FIG. 25(b)) was different in some degree from that in the body structure model 77 having the mass setting (FIG. 24(a), FIG. 25(a)) and the body structure model 41 having the door setting (FIG. 24(c), FIG. 25(c)) in a portion that was largely displaced (a roof portion and the like), but displacement of the entire automotive body shows similar inclinations.

However, values of the displacement of the automotive body as a whole in a case of using the virtual load (FIG. 24 and FIG. 25) were larger than those in a case of using the load acquired by the driving analysis (FIG. 22 and FIG. 23) (refer to "sum total of displacement" in the drawing), and it was found that a difference in the loading condition affects displacement of the automotive body.

In this way, when the case of giving the load acquired by the driving analysis was compared with the case of inputting the virtual load, a large difference was found in deformation behavior in every body structure model, so that it may be preferable to give the load acquired by the driving analysis in the optimization analysis of the optimum position at which adhesive bonding is performed with the structural adhesive.

Next, the following describes a result of the optimization analysis performed on the adhesive element as an object disposed at the position as the candidate at which adhesive bonding is performed with the structural adhesive.

In the present example, the optimization analysis of the adhesive bonding position to which the loading condition acquired by the driving analysis was given and the optimization analysis of the adhesive bonding position to which the virtual loading condition was given without performing the driving analysis were both performed, and a difference in the loading condition for the optimization analysis was examined.

In the present example, similarly to the case of the driving analysis, the optimization analysis of the adhesive bonding position was performed for each of a case of successively disposing the adhesive elements 45 in the body structure model 77 (FIG. 8) having the mass setting, a case of successively disposing the adhesive elements 45 in the body structure model 31 (FIG. 19(a)) to which the mass corresponding to the revolving door constituent parts 43 was not set, and a case of successively disposing the adhesive elements 45 in the body structure model 41 (FIG. 19(b)) to which the revolving door constituent parts 43 were set.

In this case, the adhesive element 45 was assumed to be constituted of a three-dimensional element, and the adhesive elements 45 was successively disposed on all flange portions in the body structure model. At this point, the total length of the adhesive elements that were successively disposed was 102.8 m. In the setting of 102.8 m, the adhesive elements 45 are disposed on almost all of the parts sets constituting the body structure model, and the adhesive elements 45 as objects of the optimization analysis are successively disposed also on a door opening.

Next, the optimization analysis condition was set assuming the adhesive elements 45 disposed in the body structure model to be analysis objects. In the present example, as the optimization analysis condition, maximization of the stiffness of the automotive body was set as the objective condition, and the application length of the structural adhesive was set as the constrained condition. In this case, the application length of the structural adhesive corresponds to the total length of the adhesive elements 45a that has remained through the optimization analysis. Additionally, the optimization analysis was performed by giving the loads generated at the connecting points (Nodes 1 to 12 in FIG. 4) of the body structure model 31 acquired by the driving analysis as the loading condition for the optimization analysis, and the adhesive element 45 satisfying the optimization analysis condition was obtained.

FIG. 26 to FIG. 31 illustrate a result of the adhesive elements 45a obtained by the optimization analysis performed by giving a lateral bending load to the rear side of the automotive body as the loading condition, and giving the application length of 20 m of the structural adhesive as the constrained condition.

FIGS. 26(a) and 26(b) illustrate the adhesive elements 45a obtained by performing the optimization analysis by giving, to the body structure model 31, the loads (FIG. 26(c)) acquired by the driving analysis that is performed by using the body structure model 31 to which the mass is not set, which are included in the scope according to aspects of the present invention (a first invention example). FIGS. 27(a) and 27(b) illustrate the adhesive elements 45a obtained by performing the optimization analysis by giving the virtual loads (FIG. 27(c)) to the body structure model 31 having no mass without performing the driving analysis, which are not included in the scope according to aspects of the present invention (first comparative example).

Figure 28:
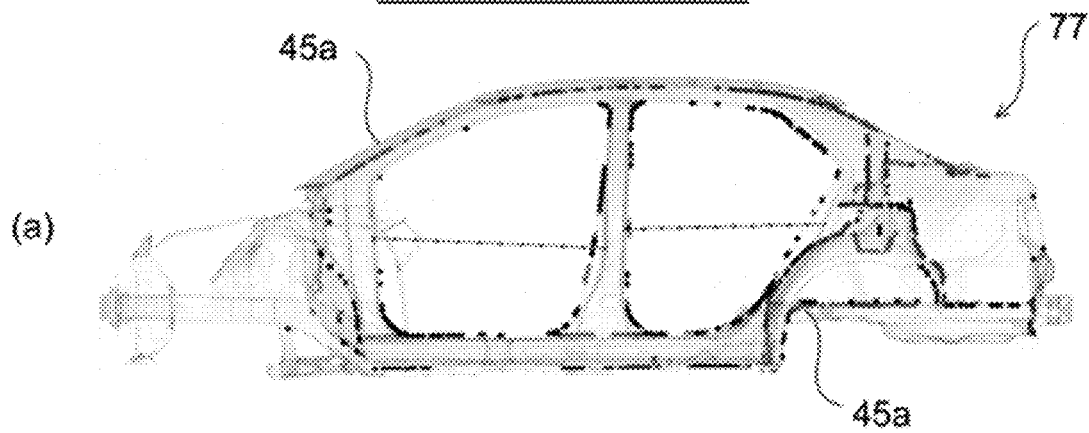
FIG. 28 is a diagram illustrating adhesive elements that are obtained by giving the loading condition acquired by driving analysis and performing optimization analysis on the adhesive elements as analysis objects disposed in the body structure model to which mass is set in the example.
Figure 28:
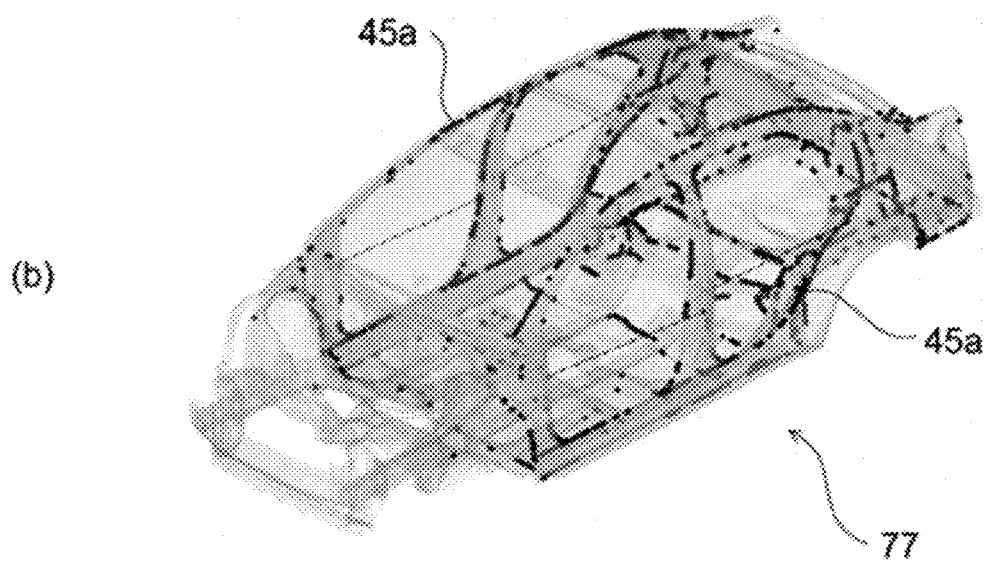
Figure 28:
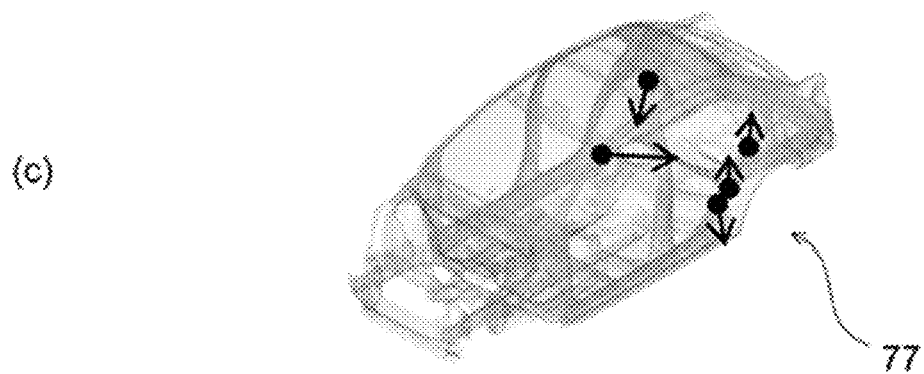
Figure 29:
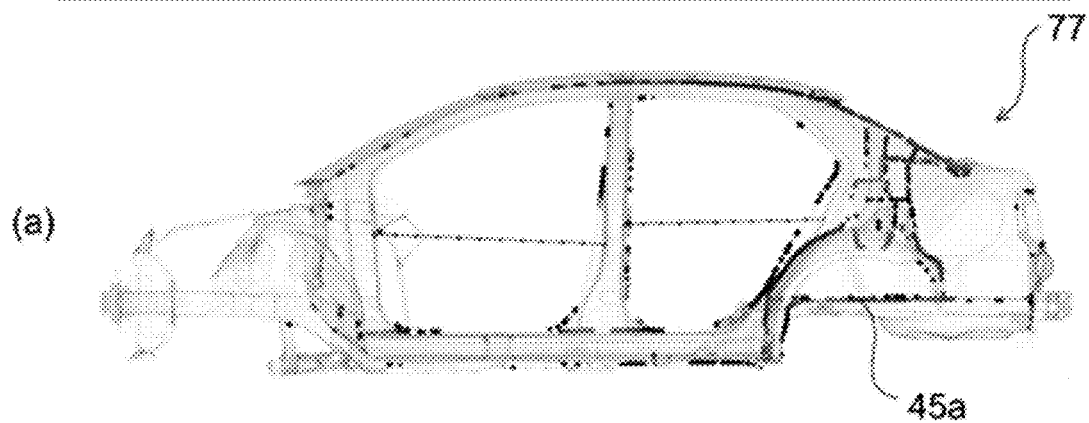
FIG. 29 is a diagram illustrating adhesive elements that are obtained by giving a virtual loading condition and performing optimization analysis on the adhesive elements as analysis objects disposed in the body structure model to which mass is set in the example.
Figure 29:
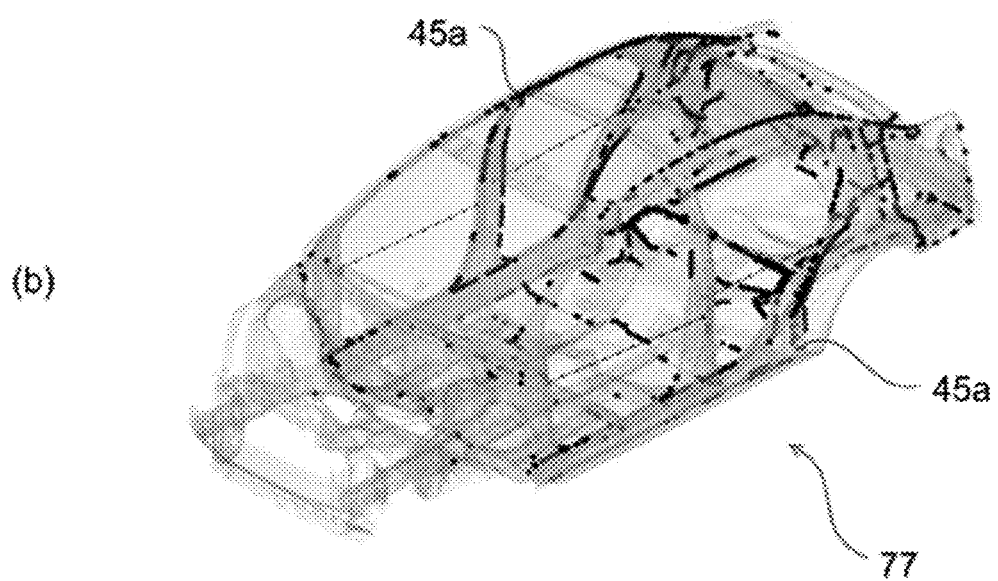
Figure 29:
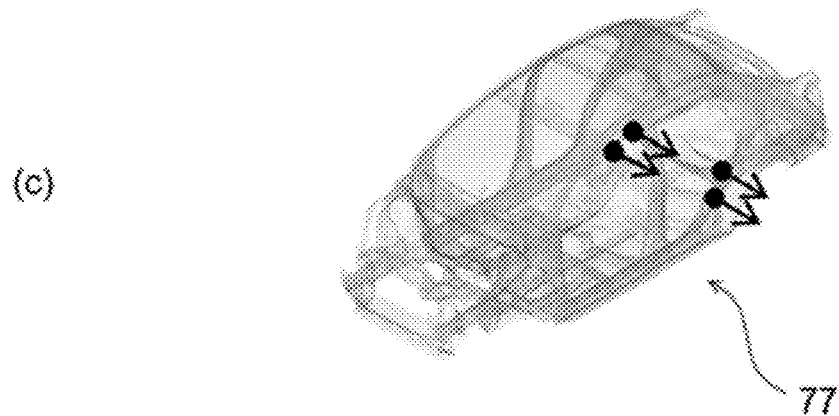

FIG. 28 and FIG. 29 illustrate a result of the adhesive elements 45a obtained by performing the optimization analysis on the adhesive elements 45 disposed in the body structure model 77 having the mass setting.

FIGS. 28(a) and 28(b) illustrate the adhesive elements 45a that are optimized by performing the driving analysis using the body structure model 77 having the mass setting and performing the optimization analysis by giving the loading condition (FIG. 28(c)) acquired by the driving analysis to the body structure model 77 having the mass setting, which are included in the scope according to aspects of the present invention (a second invention example). FIGS. 29(a) and 29(b) illustrate the adhesive element 45a that is optimized by performing the optimization analysis by giving the virtual loading condition (FIG. 29(c)) to the body structure model 77 having the mass setting without performing the driving analysis, which are included in the scope according to aspects of the present invention (a third invention example).

Figure 30:
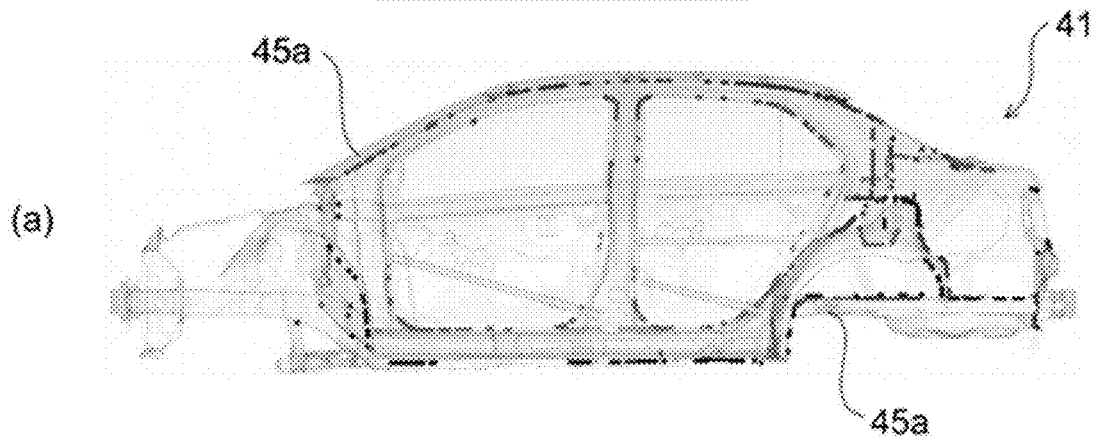
FIG. 30 is a diagram illustrating adhesive elements that are obtained by giving the loading condition acquired by driving analysis and performing optimization analysis on the adhesive elements as analysis objects disposed in the body structure model to which the revolving door constituent parts are set in the example.
Figure 30:
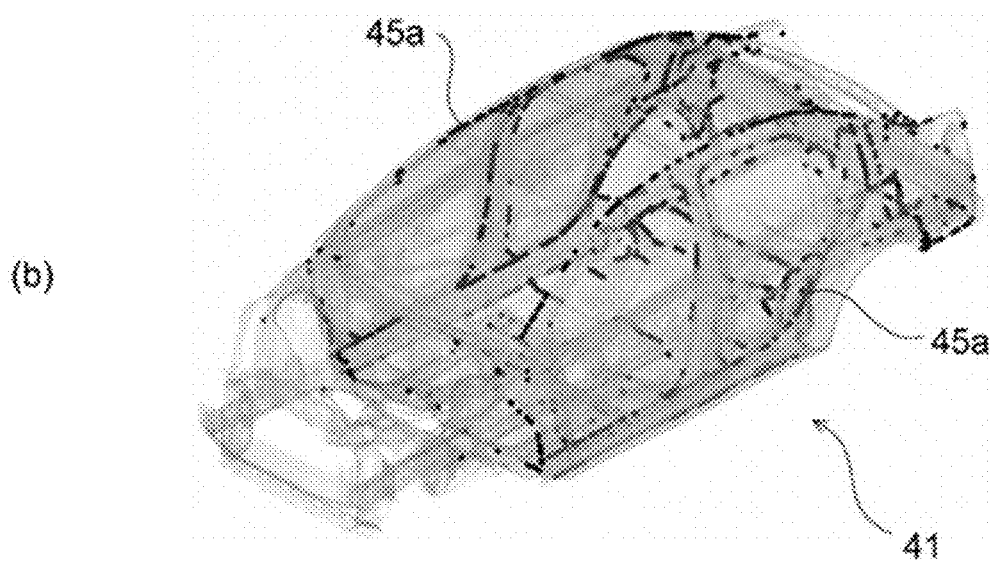
Figure 30:
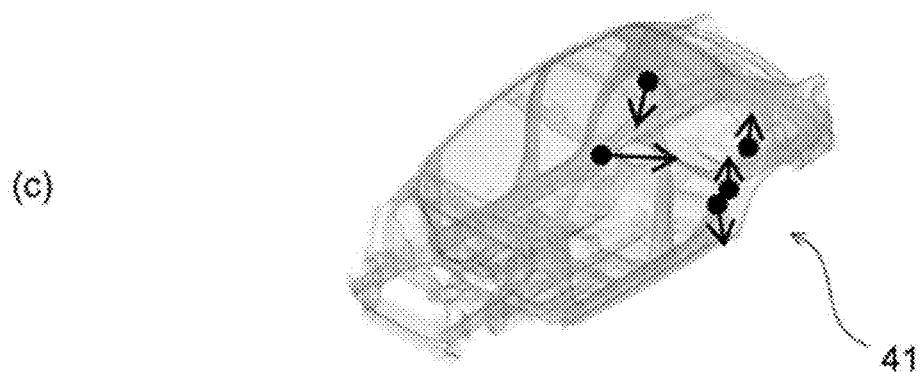
Figure 31:
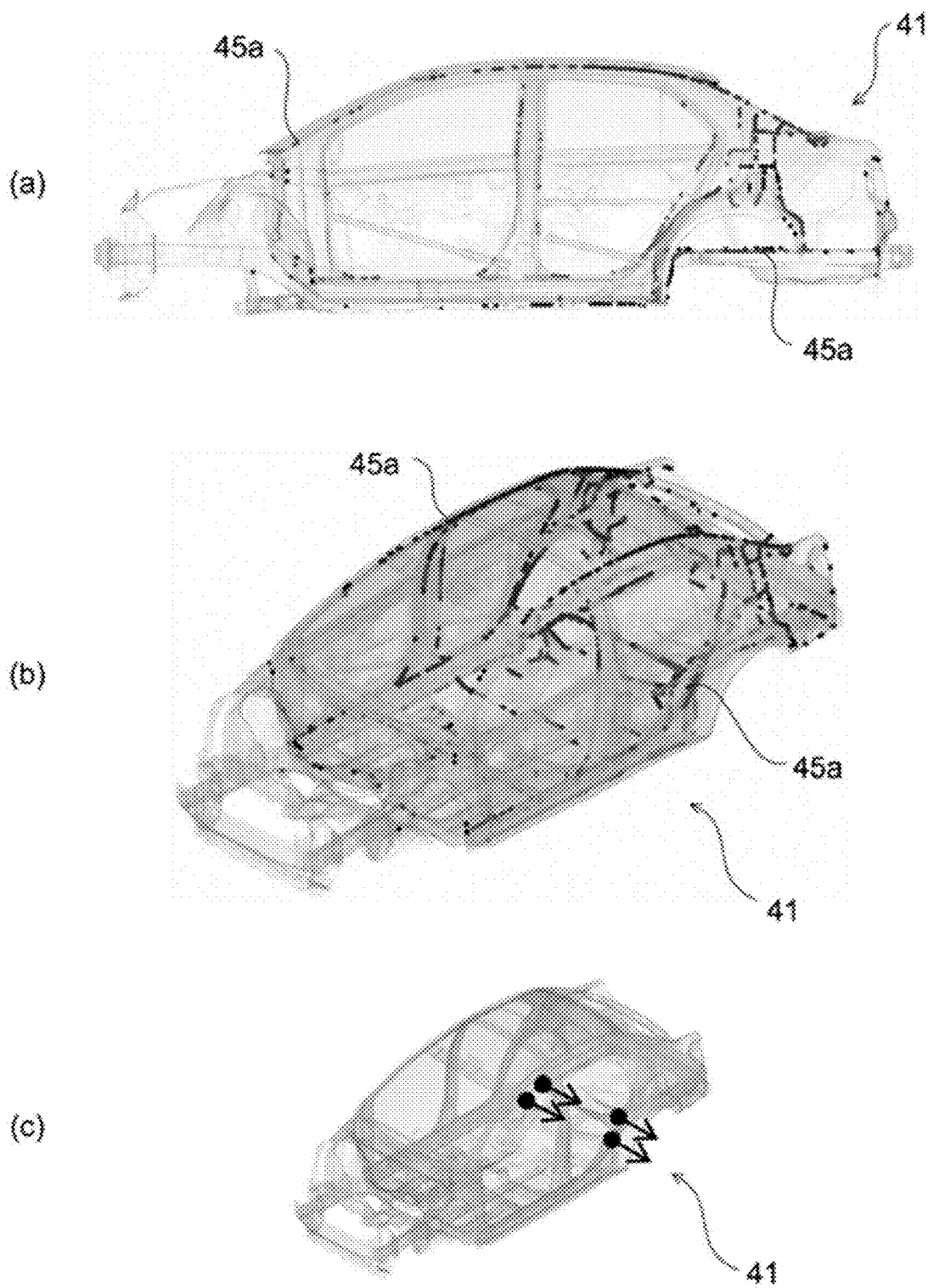
FIG. 31 is a diagram illustrating adhesive elements that are obtained by giving a virtual loading condition and performing optimization analysis on the adhesive elements as analysis objects disposed in the body structure model to which the revolving door constituent parts are set in the example.

FIG. 30 and FIG. 31 illustrate a result of the adhesive elements 45a that are optimized by performing the optimization analysis on the adhesive elements 45 disposed in the body structure model 41 having the door setting.

FIGS. 30(a) and 30(b) illustrate the adhesive elements 45a that are optimized by performing the driving analysis using the body structure model 41 having the door setting and performing the optimization analysis by giving the loading condition (FIG. 30(c)) acquired by the driving analysis to the body structure model 41 having the door setting, which are included in the scope according to aspects of the present invention (a fourth invention example). FIGS. 31(a) and 31(b) illustrate the adhesive elements 45a that are optimized by performing the optimization analysis by giving the virtual load (FIG. 31(c)) to the body structure model 41 having the door setting without performing the driving analysis, which are included in the scope according to aspects of the present invention (a fifth invention example).

The adhesive elements 45a remained around the door opening as illustrated in FIGS. 26(a) and 26(b) in the first invention example of giving the loading condition acquired by the driving analysis to the body structure model 31 having no mass setting, while no adhesive element remained around the door opening as illustrated in FIGS. 27(a) and 27(b) in the first comparative example of giving the virtual load. As a result, the positions of the adhesive elements 45a that had remained through the optimization analysis were different depending on a difference in the loading condition.

In the third invention example (FIGS. 29(a) and 29(b)) of inputting the virtual load to the body structure model 77 having the mass setting, an amount of the adhesive elements 45a that had remained around the door opening was increased as compared with the first comparative example having no mass setting. In the second invention example (FIGS. 28(a) and 28(b)) of inputting the load in the driving analysis to the body structure model 77 having the mass setting, the amount of the adhesive elements 45a that had remained around the door opening was further increased.

Additionally, in the fifth invention example of performing the optimization analysis using the body structure model 41 having the door setting, the amount of remaining adhesive elements 45a was close to that in the fourth invention example using the body structure model 77 having the mass setting.

As described above, in the optimization analysis using the loading condition acquired by the driving analysis according to aspects of the present invention, the adhesive elements remained around the door opening through the optimization analysis even in a case of using the body structure model to which any of the equipment for door assembly, the closure panels, or the mass corresponding thereto was not set, and the optimum position at which adhesive bonding is performed with the structural adhesive was able to be obtained.

In a case of performing the optimization analysis by giving the virtual loading condition without performing the driving analysis, the adhesive elements remained around the door opening by performing the optimization analysis using the body structure model to which the equipment for door assembly, the closure panels, or the mass corresponding thereto was set, and an appropriate position at which adhesive bonding is performed with the structural adhesive was able to be obtained.

Figure 32:
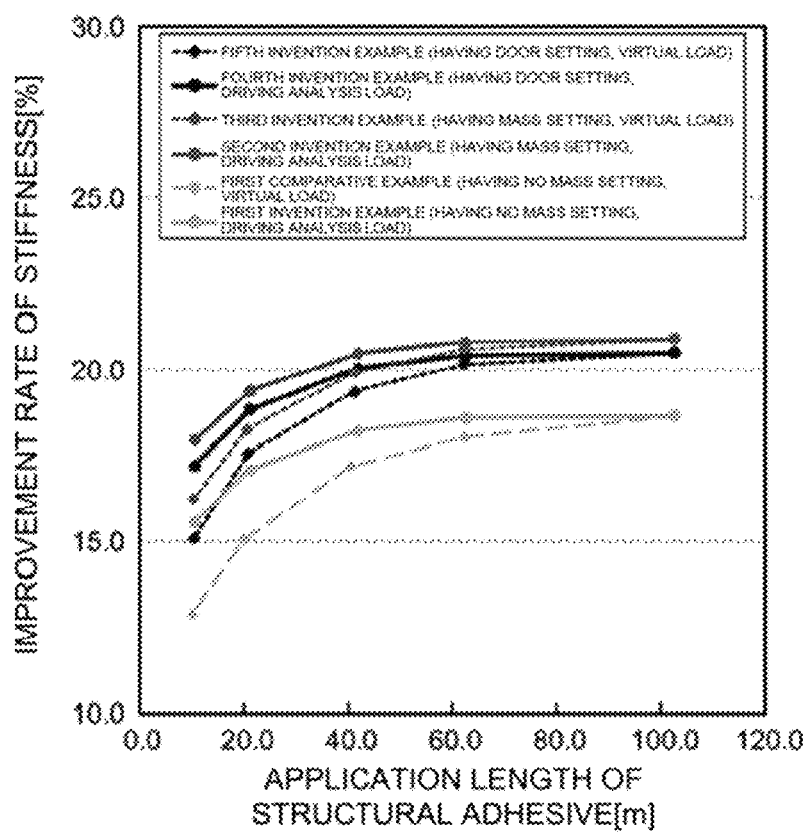
FIG. 32 is a graph illustrating an improvement rate of stiffness of the automotive body in which the adhesive elements are disposed, the adhesive elements being obtained by optimization analysis in which an application length of the structural adhesive is changed as a constrained condition in the example.

FIG. 32 illustrates a result of improvement rate of stiffness of the automotive body to which the optimized adhesive elements 45a obtained through the optimization analysis are added regarding the first invention example to the fifth invention example, and the first comparative example described above. In this case, the stiffness of the automotive body is an average value of values obtained by dividing the load by displacement at the connecting point to which the load is given, the improvement rate of stiffness is a relative change in average stiffness that is obtained based on the body structure model 31 before the optimization analysis is performed, and the adhesive element 45a that is obtained by changing the application length of the structural adhesive as the constrained condition for the optimization analysis is added.

In FIG. 32, the improvement rate of stiffness for the application length of 102.8 m of the structural adhesive is a result in a case in which the adhesive elements 45 are disposed on all of the parts sets in the body structure model 31 without performing the optimization analysis. Thus, only in a case of the application length of 102.8 m, values of the improvement rate of stiffness for a driving analysis load and the virtual load equal to each other.

With reference to FIG. 32, the improvement rate of stiffness in the first comparative example of giving the virtual load to the body structure model having no mass setting was largely deviated from the improvement rate of stiffness in the first invention example to the fifth invention example. The improvement rate of stiffness in the first invention example was largely different from the improvement rate of stiffness in the second invention example to the fifth invention example in a case in which the application length was large, but the improvement rates of stiffness thereof were substantially the same in a case in which the application length was small. Additionally, there were some differences in the values of the improvement rate of stiffness depending on a difference in the mass setting or the loading condition in the second invention example to the fifth invention example, but the differences were not so large. Changes in the improvement rate of stiffness with respect to the changes in the application length given as the constrained condition show similar inclinations.

According to the above description, it has been suggested that, with the automotive body adhesive bonding position optimization analysis method and optimization analysis device according to aspects of the present invention, the optimum position at which adhesive bonding is performed for improving the stiffness of the automobile at the time of driving can be accurately obtained by performing the optimization analysis for obtaining the optimum position at which the parts set is adhesive-bonded with the structural adhesive in combination with the welding using the body structure model to which the welding portions for welding the parts as the parts set are set in advance.

INDUSTRIAL APPLICABILITY

Aspects of the present invention can provide an automotive body adhesive bonding position optimization analysis method and optimization analysis device for obtaining an optimum position at which a parts set is adhesive-bonded with a structural adhesive in combination with welding, using a body structure model of an automobile to which a plurality of parts are welded as the parts set.

REFERENCE SIGNS LIST

1 Optimization analysis device
3 Display device
5 Input device
7 Memory storage
9 Working data memory
11 Arithmetic processing unit
13 Automobile model generation unit
15 Driving analysis unit
17 Adhesive bonding candidate position setting unit
19 Optimization analysis condition setting unit
21 Optimization analysis unit
23 Optimization analysis device
30 Body structure model file
31 Body structure model (having no mass setting)
33 Welding portion
35 Fixed connecting portion
35a Hinge (upper side)
35b Hinge (lower side)
35c Striker
37 Parts set
41 Body structure model (having door setting)
43 Revolving door constituent parts
45 Adhesive element
45a Adhesive element (remained through optimization analysis)
47 Body structure model (adhesive elements are disposed)
51 Chassis model
61 Automobile model
71 Body structure model (having mass setting)
73 Mass element
75 Rigid element
77 Body structure model (having mass setting)
81 Parts set
83 Part
83a Flange portion
83b Side wall portion
83c R portion
85 Part

The invention claimed is:

1. An automotive body adhesive bonding position optimization analysis method of obtaining an optimum position at which a parts set is adhesive-bonded with a structural adhesive in combination with welding, using a body structure model including parts constituted of two-dimensional elements and/or three-dimensional elements and having welding portions set in advance to which the parts are welded as the parts set, the optimization analysis method comprising:

generating, by a computer, an automobile model by connecting a chassis model to the body structure model to which equipment for door assembly or closure panels are set;

performing, by the computer, driving analysis of the automobile model so as to acquire, as a loading condition, a load and/or displacement caused at a connecting point of the body structure model with respect to the chassis model at the time of driving, orientation and magnitude of the load being different for each position of the connecting point;

disposing, by the computer, an adhesive element as the structural adhesive at a position on the body structure model as a candidate at which adhesive bonding is performed with the structural adhesive, wherein the adhesive element is disposed on the body structure model to which the equipment for door assembly or closure panels are set;

setting, by the computer based on an instruction from an operator, an optimization analysis condition including the loading condition applied to the body structure model in optimization analysis, to the body structure model on which the adhesive element is disposed, wherein the acquired loading condition is the loading condition to be applied to the body structure model in optimization analysis, the loading condition including the load of which orientation and magnitude is different for each position of the connecting point; and performing, by the computer, optimization analysis, by using density method of topology optimization, while considering inertia force working on the equipment for door assembly or closure panels at the time of driving of the automobile based on an inertia relief method, on the adhesive element as an optimization analysis object in the body structure model to which the optimization analysis condition is set so as to obtain a position of the adhesive element satisfying the optimization analysis condition as the position at which adhesive bonding is performed with the structural adhesive, wherein discretization is performed with a penalty coefficient in topology optimization.

2. The automotive body adhesive bonding position optimization analysis method according to claim 1, wherein a plurality of the adhesive elements are successively disposed.

3. An automotive body adhesive bonding position optimization analysis device for obtaining an optimum position at which a parts set is adhesive-bonded with a structural adhesive in combination with welding, using a body structure model including parts constituted of two-dimensional elements and/or three-dimensional elements and having welding portions set in advance to which the parts are welded as the parts set, the optimization analysis device comprising a processor comprising hardware, the processor being configured to:

generate an automobile model by connecting a chassis model to a body structure model to which equipment for door assembly or closure panels are set;

perform driving analysis of the automobile model so as to acquire, as a loading condition, a load and/or displacement caused at a connecting point of the body structure model with respect to the chassis model at the time of driving, orientation and magnitude of the load being different for each position of the connecting point;

dispose an adhesive element as the structural adhesive at a position on the body structure model as a candidate at which adhesive bonding is performed with the structural adhesive, wherein the adhesive element is disposed on the body structure model to which the equipment for door assembly or closure panels are set;

set an optimization analysis condition including the loading condition applied to the body structure model in optimization analysis, to the body structure model in which the adhesive element is disposed, wherein the acquired loading condition is the loading condition to be applied to the body structure model in optimization analysis, the loading condition including the load of which orientation and magnitude is different for each position of the connecting point; and perform optimization analysis, by using density method of topology optimization, while considering inertia force working on the equipment for door assembly or closure panels at the time of driving of the automobile based on an inertia relief method, on the adhesive element as an optimization analysis object in the body structure model to which the optimization analysis condition is set so as to obtain a position of the adhesive element satisfying the optimization analysis condition as the position at which adhesive bonding is performed with the structural adhesive, wherein discretization is performed with a penalty coefficient in topology optimization.

4. The automotive body adhesive bonding position optimization analysis device according to claim 3, wherein a plurality of the adhesive elements are successively disposed.

5. An automotive body adhesive bonding position optimization analysis method of obtaining an optimum position at which a parts set is adhesive-bonded with a structural adhesive in combination with welding, using a body structure model including parts constituted of two-dimensional elements and/or three-dimensional elements and having welding portions set in advance to which the parts are welded as the parts set, the optimization analysis method comprising:

generating, by a computer, an automobile model by connecting a chassis model to the body structure model to which mass corresponding to equipment for door assembly or closure panels is set;

performing, by the computer, driving analysis of the automobile model so as to acquire, as a loading condition, a load and/or displacement caused at a connecting point of the body structure model with respect to the chassis model at the time of driving, orientation and magnitude of the load being different for each position of the connecting point;

disposing, by the computer, an adhesive element as the structural adhesive at a position on the body structure model as a candidate at which adhesive bonding is performed with the structural adhesive, wherein the adhesive elements are disposed on a body structure model to which mass corresponding to equipment for door assembly or closure panels is set;

setting, by the computer based on an instruction from an operator, an optimization analysis condition including the loading condition applied to the body structure model in optimization analysis, to the body structure model on which the adhesive element is disposed, wherein the acquired loading condition is the loading condition to be applied to the body structure model in optimization analysis, the loading condition including the load of which orientation and magnitude is different for each position of the connecting point; and performing, by the computer, optimization analysis, by using density method of topology optimization, while considering inertia force working on the mass corresponding to equipment for door assembly or closure panels at the time of driving of the automobile based on an inertia relief method, on the adhesive element as an optimization analysis object in the body structure model to which the optimization analysis condition is set so as to obtain a position of the adhesive element satisfying the optimization analysis condition as the position at which adhesive bonding is performed with the structural adhesive, wherein discretization is performed with a penalty coefficient in topology optimization.

6. The automotive body adhesive bonding position optimization analysis method according to claim 5, wherein a plurality of the adhesive elements are successively disposed.

7. An automotive body adhesive bonding position optimization analysis device for obtaining an optimum position at which a parts set is adhesive-bonded with a structural adhesive in combination with welding, using a body structure model including parts constituted of two-dimensional elements and/or three-dimensional elements and having welding portions set in advance to which the parts are welded as the parts set, the optimization analysis device comprising a processor comprising hardware, the processor being configured to:

generate an automobile model by connecting a chassis model to a body structure model to which mass corresponding to equipment for door assembly or closure panels is set;

perform driving analysis of the automobile model so as to acquire, as a loading condition, a load and/or displacement caused at a connecting point of the body structure model with respect to the chassis model at the time of driving, orientation and magnitude of the load being different for each position of the connecting point;

dispose an adhesive element as the structural adhesive at a position on the body structure model as a candidate at which adhesive bonding is performed with the structural adhesive, wherein the adhesive elements are disposed on a body structure model to which mass corresponding to equipment for door assembly or closure panels is set;

set an optimization analysis condition including the loading condition applied to the body structure model in optimization analysis, to the body structure model in which the adhesive element is disposed, wherein the acquired loading condition is the loading condition to be applied to the body structure model in optimization analysis, the loading condition including the load of which orientation and magnitude is different for each position of the connecting point; and perform optimization analysis, by using density method of topology optimization, while considering inertia force working on the mass corresponding to equipment for door assembly or closure panels at the time of driving of the automobile based on an inertia relief method, on the adhesive element as an optimization analysis object in the body structure model to which the optimization analysis condition is set so as to obtain a position of the adhesive element satisfying the optimization analysis condition as the position at which adhesive bonding is performed with the structural adhesive, wherein discretization is performed with a penalty coefficient in topology optimization.

8. The automotive body adhesive bonding position optimization analysis device according to claim 7, wherein a plurality of the adhesive elements are successively disposed.

* * * * *